US008294336B2

(12) United States Patent
Priya

(10) Patent No.: US 8,294,336 B2
(45) Date of Patent: Oct. 23, 2012

(54) PIEZOELECTRIC WINDMILL APPARATUS

(75) Inventor: Shashank Priya, Blacksburg, VA (US)

(73) Assignee: Board of Regents, The University of Texas Systems, Austin, TX (US)

( * ) Notice: Subject to any disclaimer, the term of this patent is extended or adjusted under 35 U.S.C. 154(b) by 245 days.

(21) Appl. No.: 12/544,522

(22) Filed: Aug. 20, 2009

(65) Prior Publication Data

US 2010/0052324 A1    Mar. 4, 2010

Related U.S. Application Data

(63) Continuation-in-part of application No. 11/252,923, filed on Oct. 18, 2005, now Pat. No. 7,686,974.

(51) Int. Cl.
*H01L 41/113* (2006.01)

(52) U.S. Cl. ........................................ 310/339

(58) Field of Classification Search ............ 310/339
See application file for complete search history.

(56) References Cited

U.S. PATENT DOCUMENTS

| | | | | |
|---|---|---|---|---|
| 3,539,841 A | * | 11/1970 | Riff | 310/339 |
| 3,546,120 A | | 12/1970 | Ouchi et al. | |
| 3,728,263 A | | 4/1973 | Nishida et al. | |
| 4,467,236 A | | 8/1984 | Kolm et al. | |
| 4,853,580 A | * | 8/1989 | Sula | 310/339 |
| 5,034,648 A | * | 7/1991 | Gastgeb | 310/330 |
| 5,801,475 A | | 9/1998 | Kimura | |
| 5,977,690 A | | 11/1999 | Ellis et al. | |
| 6,060,817 A | * | 5/2000 | Mullen et al. | 310/339 |
| 6,207,069 B1 | | 3/2001 | Kurukawa | |
| 6,308,356 B1 | | 10/2001 | Frederick et al. | |
| 7,239,066 B2 | | 7/2007 | Ott et al. | |
| 7,282,838 B2 | * | 10/2007 | Zanella et al. | 310/339 |
| 7,443,083 B2 | * | 10/2008 | Genis et al. | 310/339 |
| 7,808,158 B1 | * | 10/2010 | Deeds et al. | 310/339 |
| 7,821,183 B2 | * | 10/2010 | Rastegar | 310/339 |
| 2002/0185937 A1 | * | 12/2002 | Heim et al. | 310/339 |
| 2005/0017602 A1 | | 1/2005 | Arms et al. | |
| 2005/0269907 A1 | * | 12/2005 | Erickson | 310/339 |
| 2005/0280334 A1 | * | 12/2005 | Ott et al. | 310/339 |
| 2009/0058099 A1 | * | 3/2009 | Ghassemi | 290/4 B |
| 2010/0308691 A1 | * | 12/2010 | Hayamizu | 310/339 |

FOREIGN PATENT DOCUMENTS

| | | | |
|---|---|---|---|
| JP | 11303726 | | 11/1999 |
| JP | 2003014558 | | 1/2003 |
| JP | 2005237156 | | 9/2005 |
| JP | 2009-156035 A | * | 7/2009 |
| JP | 2009-243393 A | * | 10/2009 |
| WO | 2006012437 | | 2/2006 |

OTHER PUBLICATIONS

Islam, Rashed A. et al., "Realization of high-energy density polycrystalline piezoelectric ceramics", Applied Physics Letters 2006, 88, 032903.

(Continued)

*Primary Examiner* — Thomas Dougherty
(74) *Attorney, Agent, or Firm* — Kilpatrick Townsend & Stockton LLP

(57) ABSTRACT

A piezoelectric windmill configured to handle small scale wind flow. One embodiment the piezoelectric windmill solves problems associated with harvesting energy and generating electric energy or power using piezoelectric materials having significant advantages over previously available materials.

9 Claims, 22 Drawing Sheets

OTHER PUBLICATIONS

Moulson, A. J. et al., "Electroceramics", Electroceramics: Materials, Properties, Applications 2003, 2nd Edition, 92-93; 133-134; 240-242; 335-337; 546.

Priya, Shashank "Modeling of electric energy harvesting using piezoelectric windmill", Applied Physics Letters 2005, 87, 184101.

Priya, Shashank et al., "Peizoelectric Windmill: A Novel Solution to Remote Sensing", Japanese Journal of Applied Physics 2005, vol. 44, No. 3, L104-L107.

Timoshenko, S. "Analysis of Bi-Metal Thermostats", J. Opt. Soc. Am. 1925, 11: 233-255.

* cited by examiner

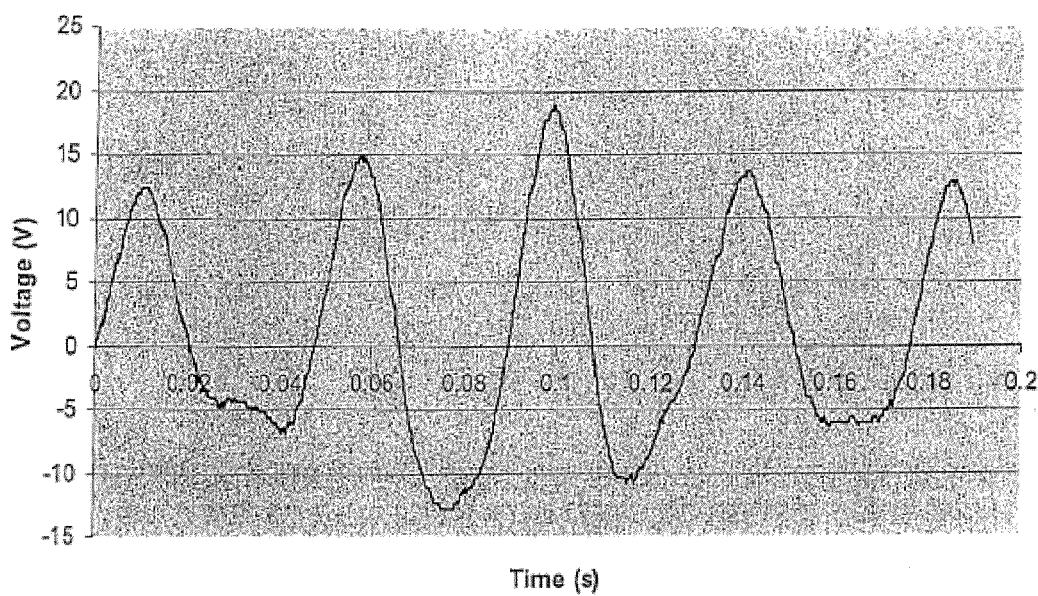

US 8,294,336 B2

PIEZOELECTRIC WINDMILL APPARATUS

CROSS-RELATED APPLICATIONS

The present application is a continuation-in-part of U.S. application Ser. No. 11/252,923, filed Oct. 18, 2005, which is incorporated by reference herein.

BACKGROUND OF THE INVENTION

One embodiment relates generally to ceramic materials, in particular, ceramic materials piezoelectric coupled with windmill-like devices.

Large scale electrical power is presently produced through various techniques including converting wind flow to electrical energy. Energy production from wind flow is typically accomplished by means of a windmill transferring a rotational force to an electromagnetic generator. Conventional electromagnetic generators employ a moving coil of electrically conducting material in a magnetic field. Normally the electrical conductor is a copper (or aluminum) wire. As is well known in the art, the movement of a coil of electrically conducting material in a magnetic field produces an electric current. This effect is commonly referred to as the "dynamo" principle. However, use of such electromagnetic generators is highly inefficient on a small scale. The efficiency of large turbines are in the range of 15-20%. This efficiency drops significantly as the size of the turbine is reduced. As such, conventional electromagnetic generators are not efficient for scale energy production from wind flow at small speeds.

For many applications in outdoor, remote or inaccessible locations, small scale energy production is often desirable from wind flow. Such applications include, without limitation, autonomous sensor networks, wireless sensor networks for border intrusion monitoring and weather stations, lighting inside tunnels and remote locations, power sources for recharging batteries and the like. To date, the potential for small scale energy production from wind flow has not been fully realized. The challenges associated with small scale electric energy generation include, without limitation: (i) converting random wind flow into a periodic mechanical AC stress, (ii) realizing a significant magnitude of stress (>0.5 N), (iii) enhancing the frequency of the stress cycle (>5 Hz), and (iv) producing a means of generation that is light weight and cost effective. The wind speeds of interest for small scale energy production from wind flow typically are in the range of 3-10 miles/h. At these speeds, the force generated from small size vanes is very small (<0.1 N), which makes the use of any kind of electromagnetic generator or "dynamo" difficult. Most of the electromagnetic motors require rpm in excess of 2000 which is not feasible from the small scale blades.

Small size dynamo systems or alternators or generators have been developed for use with bicycles to provide electrical power to the bicycle's front and tail lights. The alternators or generators found on bicycles are typically either: (i) hub dynamos built into the front hub, (ii) bottle dynamos attached to a fork leg and rotated by a small wheel in contact with the tire sidewall, or (iii) bottom bracket dynamos bolted between the chain stays behind the bottom bracket and powered by a roller against the tire. The AC mechanical amplitude energy available from a bicycle's motion at speeds of 4-6 miles/h is quite large as compared to the random wind flow. As such, the alternators or generators found on bicycles are not efficient for scale energy production from wind flow.

Thus, there does not exist an effective way in the prior art for scale energy production from wind flow that is effective and efficient.

SUMMARY OF THE INVENTION

In one embodiment, the piezoelectric windmill includes a rotatable portion, a stationary portion, a first circuitry for combining a first electrical output and a second electrical output, and a second circuitry for providing the combined electrical output. The rotatable portion includes a shaft, a fan housing having an open interior and circumscribing the shaft, a plurality of fan blades each mounted on the fan housing, and a first plurality of permanent magnets each attached to the fan housing and having a direction of magnetization and poles. The poles of the first plurality of permanent magnets face inward in a radial direction and alternate with each successive of the first plurality of permanent magnets. The stationary portion includes a housing for rotatably supporting the shaft, an electromagnetic generator means attached to the housing and rotatably connected to the shaft, a stationary disc attached to the fan housing, a plurality of piezoelectric bimorphs attached to the disc, and a second plurality of permanent magnets each attached to a corresponding one of the plurality of piezoelectric bimorphs and having a direction of magnetization and poles. The electromagnetic generator means provides the first electrical output as the shaft is rotated. The poles of the second plurality of permanent magnets face outward in a radial direction and alternate with each successive of the second plurality of permanent magnets. The second plurality of permanent magnets are in radial alignment with the first plurality of permanent magnets such that the plurality of piezoelectric bimorphs provide the second electrical output resulting from oscillations in the plurality of piezoelectric bimorphs as the fan housing is rotated and the second plurality of permanent magnets magnetically interact with the first plurality of permanent magnets.

Those skilled in the art will further appreciate the above-noted features and advantages of the invention together with other important aspects thereof upon reading the detailed description that follows in conjunction with the drawings.

BRIEF DESCRIPTION OF SEVERAL VIEWS OF THE DRAWINGS

For a more complete understanding of the features and advantages of one embodiment, reference is now made to the detailed description of the invention along with the accompanying figures in which corresponding numerals in the different figures refer to corresponding parts.

(FIG. 5B) the rectified output voltage as a function of frequency set at 6 Hz with a load of 4.6 kΩ.

(FIG. 7C) is a picture of loading of the bimorphs using rectangular hooks.

FIG. 20 is a waveform illustrating a variation of the rectified power as a function of the translation distance for the piezoelectric windmill according to one embodiment.

DETAILED DESCRIPTION OF THE EMBODIMENTS

Figure 1:
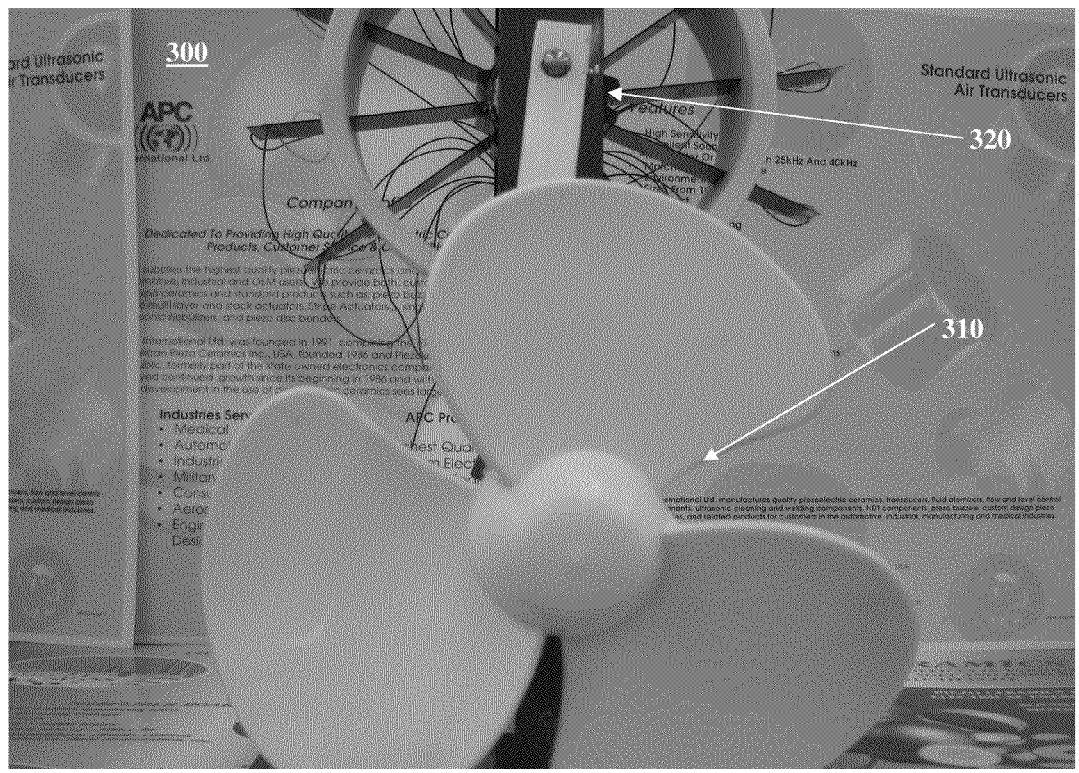
FIG. 1 is a photograph of the piezoelectric windmill in accordance with one aspect of one embodiment.

Although making and using various embodiments of one embodiment are discussed in detail below, it should be appreciated that one embodiment provides many inventive concepts that may be embodied in a wide variety of contexts. The specific aspects and embodiments discussed herein are merely illustrative of ways to make and use the invention, and do not limit the scope of the invention. In the description which follows like parts may be marked throughout the specification and drawing with the same reference numerals, respectively. The drawing figures are not necessarily to scale and certain features may be shown exaggerated in scale or in somewhat generalized or schematic form in the interest of clarity and conciseness.

In one embodiment, the piezoelectric windmill apparatus 300 uses wind energy for electric-power generation, because wind provides a constant source of mechanical energy as opposed to other sources that are often random and difficult to control. In one embodiment, piezoelectric material is arranged as a bimorph transducer so as to provide piezoelectric effects through an energy generator structure resembling a windmill, as shown in FIG. 1. A piezoelectric bimorph transducer structure is used; however, other transducer structures may be coupled with the piezoelectric bimorph transducers, such as unimorph transducers, multimorph transducers, a multilayer ceramic element, and electromagnetic transducers, as explained further below.

Figure 2A:
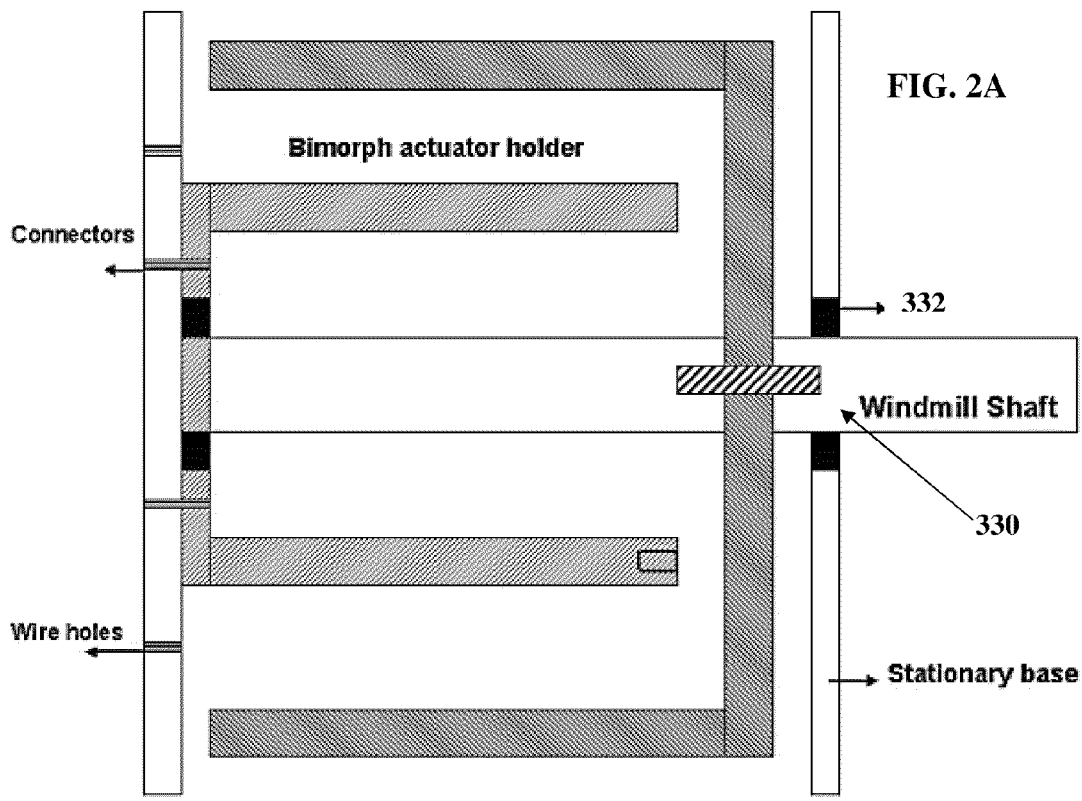
FIGS. 2A and 2B are schematics of the piezoelectric windmill structure including (2A) a bimorph actuator holder and assembly mount on a rotating shaft and (2B) cross-section of a fan-assembly, hanging weight and cam-shaft mechanism for generating the oscillatory motion in accordance with still another aspect of one embodiment.
Figure 2B:
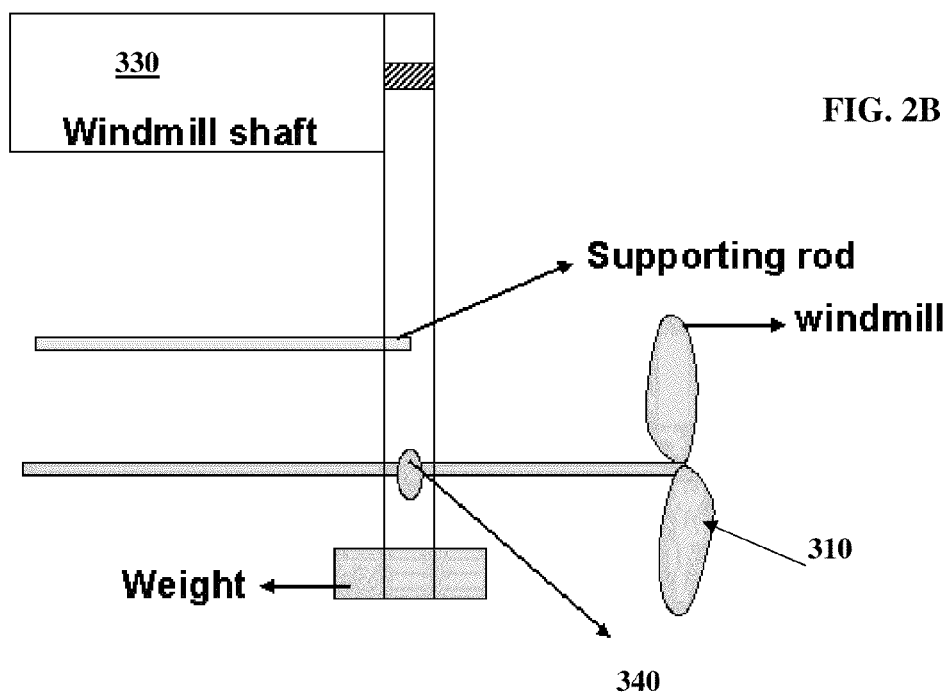

The piezoelectric windmill 300 comprises a windmill blade 310 coupled to a piezoelectric bimorph arrangement 320, as shown in FIG. 1. The piezoelectric bimorph arrangement 320 includes a bimorph actuator holder coupled to the windmill shaft 330 and a ball bearing 332, as shown in FIG. 2A. The windmill shaft 330 is rotated by the motion of the wind using a camshaft mechanism 340, as shown in FIG. 2B. An oscillating torque is generated through the flowing wind actuating the windmill and applied on the actuators. The wind flow causes the fan to rotate and the torque generated from the rotation of the fan is transferred to the windmill shaft by using a cam of height equal to the circumferential distance between the two stoppers and a hanging weight of 23.5 gm in the form of beam. The rotation of the fan results in generation of the oscillatory motion of the weight and this motion is transferred to the windmill shaft that oscillates the stoppers.

Figure 3:
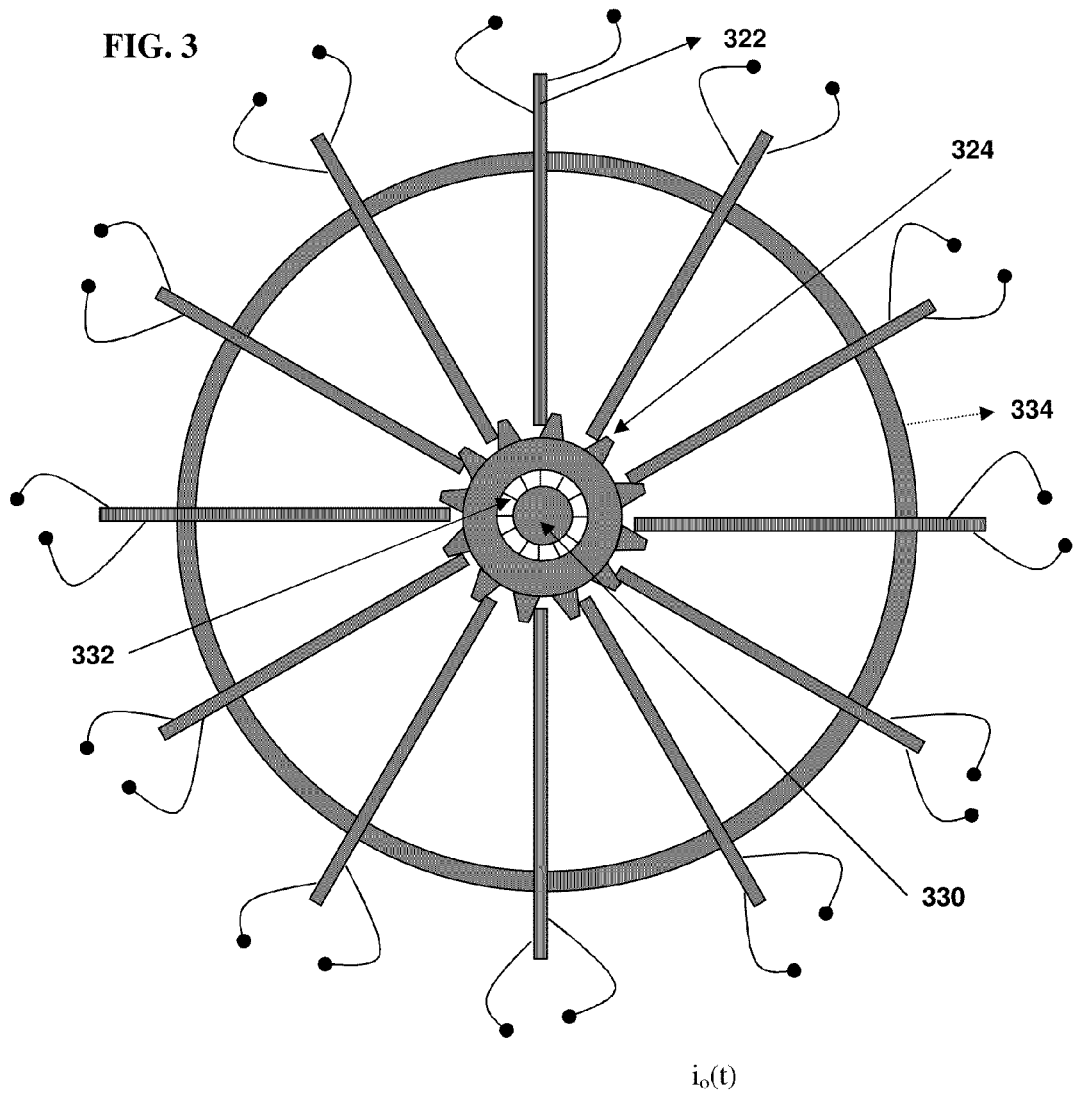
FIG. 3 is a schematic of the piezoelectric bimorph arrangement in the piezoelectric windmill in accordance with one embodiment.

In one embodiment, the piezoelectric bimorph arrangement 320 includes a plurality of bimorphs 322 arranged around the circumference of the windmill shaft 330, as shown in FIG. 3. The piezoelectric bimorph arrangement includes bimorph actuator holder 324 and a plurality of stoppers 334 fixedly associated with a ball bearing 332 circumferentially surrounding the windmill shaft 330. The ball bearing 332 is designed to be with very low friction. Each bimorph 322 is adjusted such that it just touches the tip of the stopper 334. The displacement of the bimorph 322 under maximum torque is equal to the gap between the stoppers and thus it oscillates between the gaps of the stoppers. The continuous back and forth oscillation of the bimorph between the adjacent stoppers continuously generates electricity.

In one embodiment, the dimensions of each bimorph is 60×20×0.5 mm³ having a preload of 23.5 gm, which includes a resonance frequency of 65 Hz, and a capacitance of 170 nF. The resonance frequency is proportional to its length where higher the length lower is the resonance frequency. The output voltage from the bimorph is given as: $2 \times 10^{-2} L^2/hL_tW$ (where $L_t$ is the free length and all the units in this equation are in MKS system.

A bimorph is a cantilever that consists of two active piezoelectric layers, and these layers produce a displacement via electrical activation as in a piezoelectric bimorph (electric field(s) cause one layer to extend and the other layer to contract). Conventional hard and soft ceramics may be used for the piezoelectric material and in order to obtain high performance at low frequencies far from the resonance, the piezoelectric material with a high figure of (d·g) may be selected or piezoelectric ceramics with high piezoelectric strain constant may be selected. Piezoelectric bimorphs are composed of ceramic materials including, without limitation, modified lead zirconate titanate (PZT) compositions, barium titanate compositions and lead titanate compositions. In one embodiment, the ceramic composition of the formula $Pb[(Zr_{0.52}Ti_{0.48})O_3]_{1-x}[(Zn_{1/3}Nb_{2/3})O_3]_x+Mn$, wherein Pb is lead, Zr is zirconium, Ti is titanium, O is oxygen, Nb is niobium, Mn is manganese which is present in various forms from about 0.1 to 1.5 wt %, and x is 0.05-0.2. Under a nominal torque level corresponding to normal wind flow and oscillating frequency of 6 Hz, a power of 10.2 mW was successfully measured across a load of 4.6 kΩ after rectification. By addition of a DC-DC converter, energy harvesting is improved by a factor of 4 with an efficiency of between 74 to 88%.

Figure 5A:
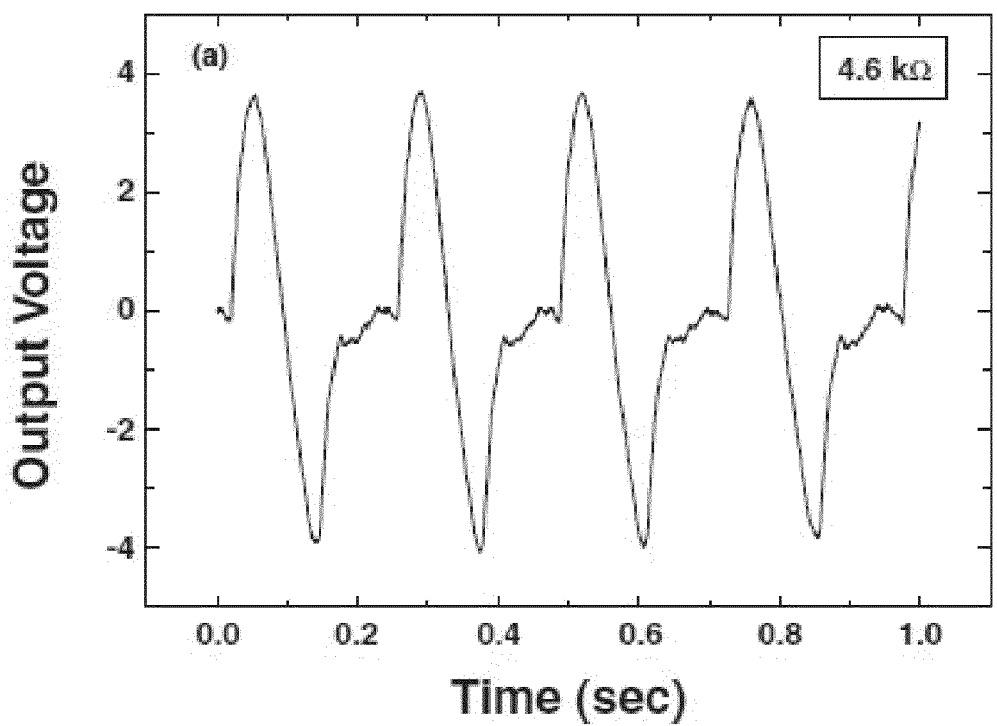
FIGS. 5A-B are graphs of energy output from eleven bimorphs connected and showing (FIG. 5A) output voltage waveform across a 4.6 kΩ load and frequency of 4.2 Hz.
Figure 5B:
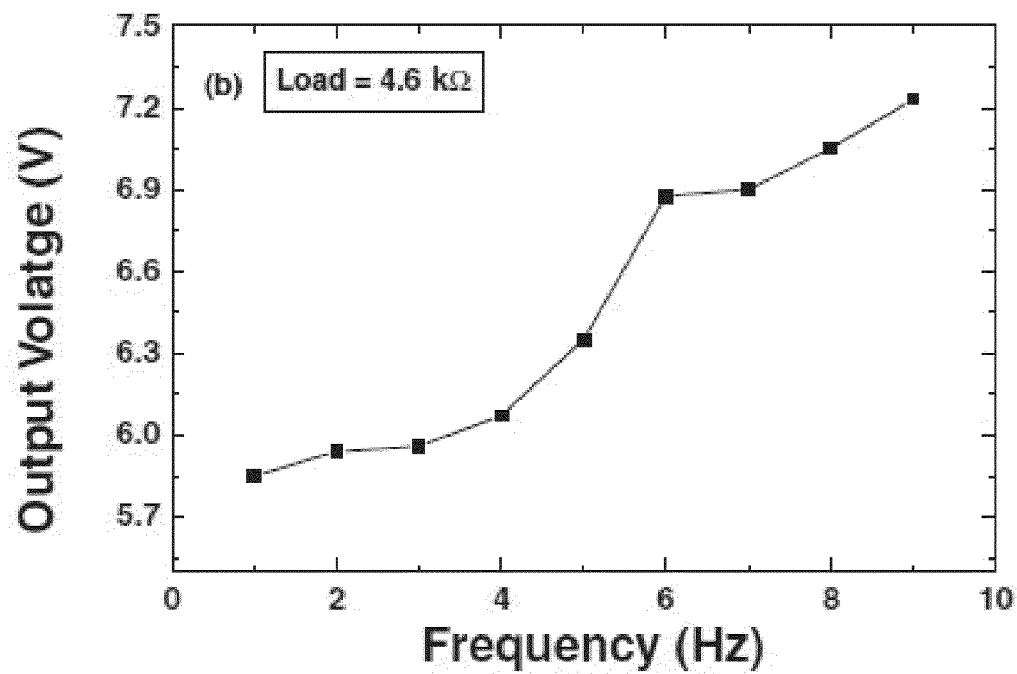

FIG. 5A shows the signal waveform generated from the piezoelectric windmill at the frequency of 4.2 Hz measured across the 4.6 kΩ resistor. A peak voltage of 3.75V was obtained in this case. FIG. 5B shows the frequency dependence of the rectified output voltage.

Figure 4:
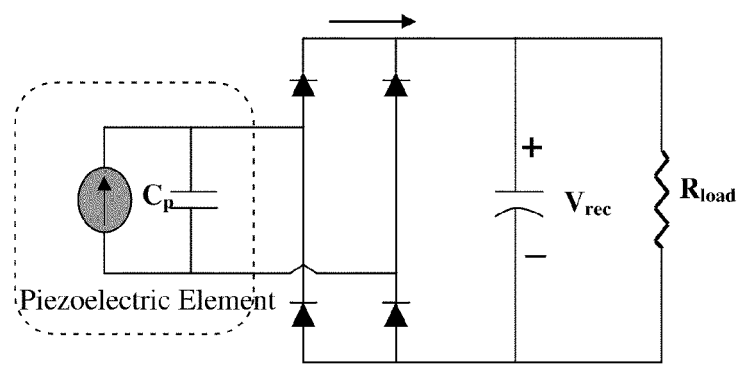
FIG. 4 is a schematic of a rectifier circuit used for measuring power.

A rectification circuit may be used for measurement of the output voltage and power of the piezoelectric windmill, as shown in FIG. 4. The peak voltage increases with frequency of the oscillation, which generates more electrical energy available during each cycle. For one embodiment, the matching load is decreased by at least 100 times and may be further reduced by increasing the number of bimorphs in the windmill. The electrical energy generated provided by the piezoelectric windmill is stored in the capacitor or in miniaturized Li-batteries, as examples, and transmitted wirelessly to power various remote devices including sensors for weather monitoring and/or structural health monitoring, accelerometers, strain gages, thermal sensors, switches and alarms, as examples, all of which require power in the range of 10-50 mW. Power is readily controlled by adjusting the number of bimorphs in the piezoelectric windmill, i.e. including more bimorphs provides more power. The piezoelectric windmill may thus be combined with wireless transmission and provide a practical solution to large scale and remote powering of sensors and/or communication devices.

In still another embodiment, a model for determination of generated electric power from piezoelectric bimorph transducers in low frequency range far from the piezoelectric resonance is provided. The model comprises at least two parts. The first part includes computing the open circuit voltage response of the transducer under the ac stress based on the bending beam theory for the bimorph. The second part includes using the open circuit voltage as the input to the equivalent circuit of the capacitor connected across a pure resistive load. The model was verified by comparing it with the measured response of another piezoelectric windmill comprising 10 piezoelectric bimorph transducers that operated with a wind speed of 1-12 mph. Each bimorph was approximately 60×20×0.6 mm³ with a free length of 53 mm. The resonance frequency and capacitance for this size of bimorph was measured as 65 Hz and 170 nF, respectively. The oscillatory motion is generated using the cam-shaft gear mechanism (see FIGS. 3, 2A and 2B) with a continuous back and forth oscillation of bimorph between two stoppers that continuously generates electricity. A power of 7.5 mW at the wind speed of 10 mph was measured across a matching load of 6.7 kΩ. The theoretical model was found to give very accurate prediction of the generated power and matching load and an excellent matching was found with the experimental results. The theoretical approach provided a determinitistic measure of the characteristic of the piezoelectric device consisting of piezoelectric bimorphs.

The structure and frame-work of this piezoelectric windmill example has active piezoelectric blades (similar to that shown in FIGS. 3-2A & 2B). As the wind flows through the windmill the active blades oscillate in turn producing electricity. The power generation from the piezoelectric bimorphs loaded in the cantilever form as in the case of windmill can be modeled using the bending beam theory developed by Timoshenko (Timoshenko, S., J. Opt. Soc. Am. 1925:11; 233; Moulson, A. J. and Herbert, J. M., 2003, Electroceramics, John Wiley & Sons Inc., NJ, USA, both incorporated herein by reference).

Figure 6A:
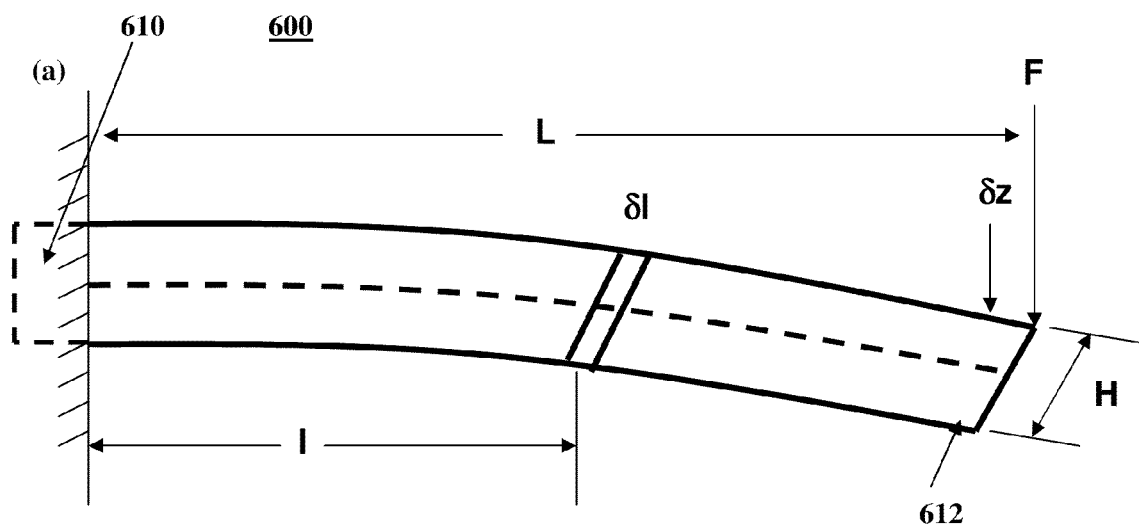
FIG. 6A is a schematic of a piezoelectric windmill structure of one embodiment showing strain in a bent rectangular section cantilever for width w and thickness H.

FIG. 6A shows a schematic of one embodiment of the piezoelectric windmill as a thin long bimorph cantilever 600, which is clamped at one end 610 while the wind flow will vibrate or displace the second end 612 to generate electricity. In one embodiment, the long bimorph cantilever 600 comprises a long sheet of bimorph, where a cam-shaft mechanism is not needed. The cantilever loading of a bimorph is where a force F produces a bending moment varying linearly along the length of the beam. Strain in a bent rectangular section cantilever for width w, thickness H, total length L, length at bending moment 1, change in length δ1, and change in thickness δz from force F. The bending moment is maximum at the fixed end and zero at the free end. In one embodiment, the piezoelectric windmill may consist solely of the The electromechanical effect in the piezoelectric take place at constant electric displacement (D) and so the open circuit voltage is given by the relation $$\left(\frac{\partial E_3}{\partial X_1}\right)_D = -h_{31}, \quad (1)$$

where $h_{31}$ is the piezoelectric constant expressed as:

$$h_{31} = g_{31}(c_{11}^D + c_{12}^D) + g_{33}c_{13}^D \quad (2)$$

The field ($E_i$) developed at length, l is given as:

$$E_3(l) = h_{31} \frac{3}{4} \frac{H}{L^3}(L-l)\delta z, \quad (3)$$

where H is the total thickness and L is the length of the bimorph. The charge ($Q_{\delta l}$) generated on the element $\delta l$ is given as:

$$Q_{\delta l} = \in_{33}^x E_3(l) w \delta l, \quad (4)$$

where w is the width of the bimorph. The total generate charge ($Q_T$) can be computed using the Equation (5):

$$Q_T = \frac{3}{4} \frac{Hw}{L^3} \delta z \varepsilon_{33}^x h_{31} \int_0^L (L-l) dl, \quad (5)$$

The voltage generated across two oppositely poled plates connected in parallel can be determined using the relation $V_{OC} = Q_T/C^x$, where $C^x$ is the clamped capacitance of one of the bimorph plates. Using Equation (5) the voltage generated is given as:

$$V_{OC} = \frac{3}{8}\left(\frac{H}{L}\right)^2 h_{31} \delta z. \quad (6)$$

The parameters for the bimorph used in the piezoelectric windmill were H=0.6 mm, L=53 mm, $h_{31}$=−1.67×10$^8$ V/m, and δz=1.5 mm. The magnitude of the $h_{31}$ constant was calculated using the magnitude of materials constants available for the piezoelectric ceramic APC 855.11 Substituting these numbers in Eq. (6) the open circuit voltage of the bimorph is determined to be 12.04 V. This value was in agreement with the measurement.

Figure 6B:
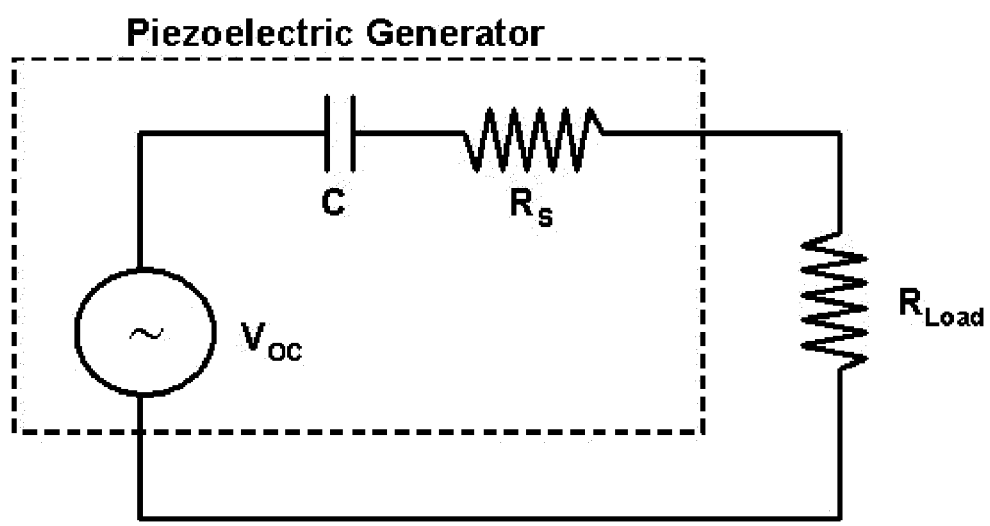
FIG. 6B depicts a schematic of an equivalent circuit representation of a piezoelectric generator in accordance with one embodiment.

The load dependence of the piezoelectric generator can be computed by using the equivalent circuit representation similar to that shown in FIG. 6B. This equivalent circuit is only valid in the frequency range far from the resonance. In this circuit the voltage source is taken to be the open circuit voltage across the bimorph. The voltage across the load may be expressed as:

$$V_{Load} = V_{OC} \left| \frac{R_{Load}}{R_{Load} + \frac{1}{j\omega C} + R_S} \right|, \quad (7)$$

where $R_S$ is the series resistance and C is the damped capacitance of the bimorph. The equivalent circuit parameters were determined using the impedance analyzer HP 4194A and were found to be C=2.596 μF and $R_S$=149.73 at a frequency of 10 Hz. The average power delivered to the load may be found using expression:

$$P = \frac{V_{Load}^2}{2R_{Load}}. \quad (8)$$

Using the above expression the magnitude of average power at 10 Hz frequency and across 6.7 kΩ resistor was determined to be 5.75 mW. The power reaches maximum at an optimum load ($R_{Load}^{opt}$) which for the equivalent circuit shown in FIG. 6B is given as:

$$R_{Load}^{opt} = \left| R_S + \frac{1}{j\omega C} \right|. \quad (9)$$

Figure 6C:
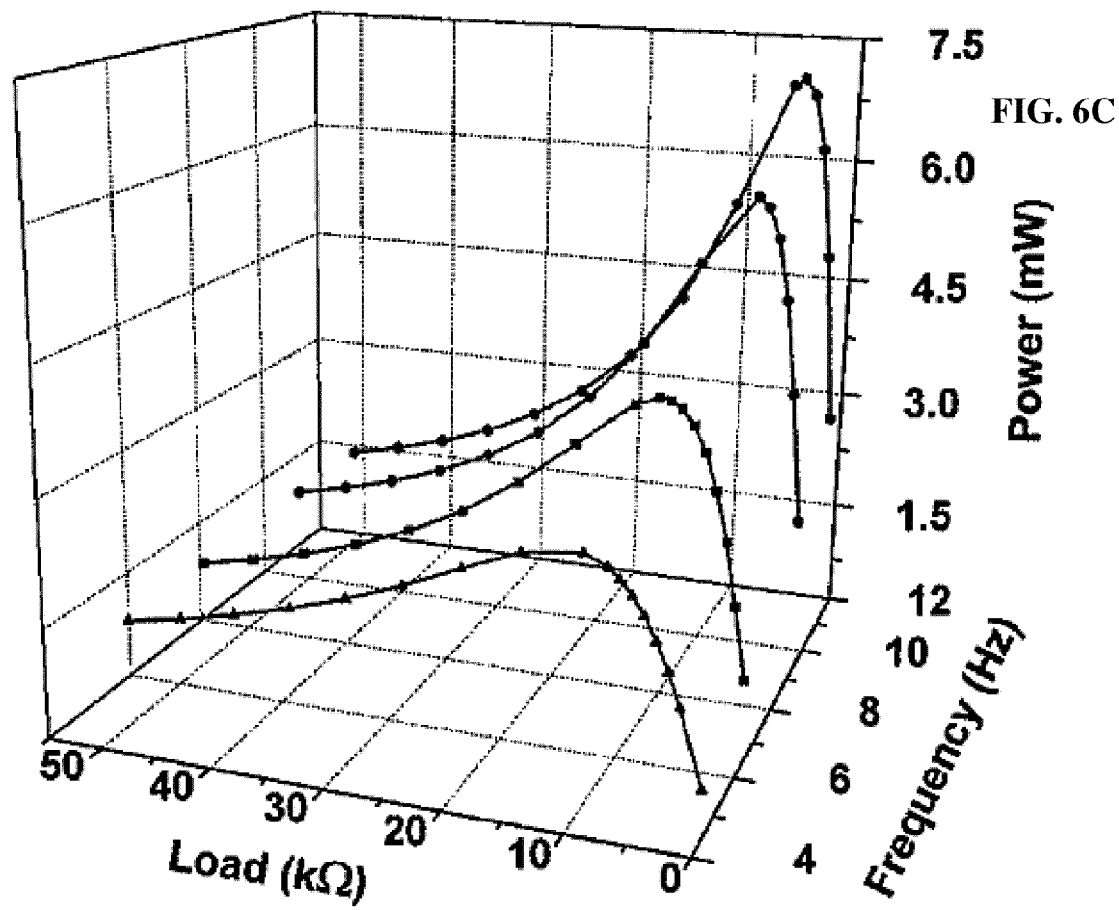
FIG. 6C is a graph showing the variation of the power as a function of the load for different frequencies, where the power reaches maxima at an optimum load.

FIG. 6C shows the variation of the power calculated using the Eq. (8) as a function of load and various frequencies. The curves are plotted for the frequency of 5, 7, 10, and 12 Hz. Power increases almost linearly with frequency over the whole range, and the magnitude of matching load drops down rapidly with increasing frequency but saturates at higher frequencies.

With piezoelectric ceramic compositions of one embodiment provided in a piezoelectric generator structure as described above and using the equations provided herein, power was found to increase almost linearly with frequency over the whole range. The magnitude of matching load dropped with increasing frequency but saturated at higher frequencies. Overall, variations in the saturated frequency of the piezoelectric generator structure described herein were found to have a linear relationship with wind speed.

Figure 7A:
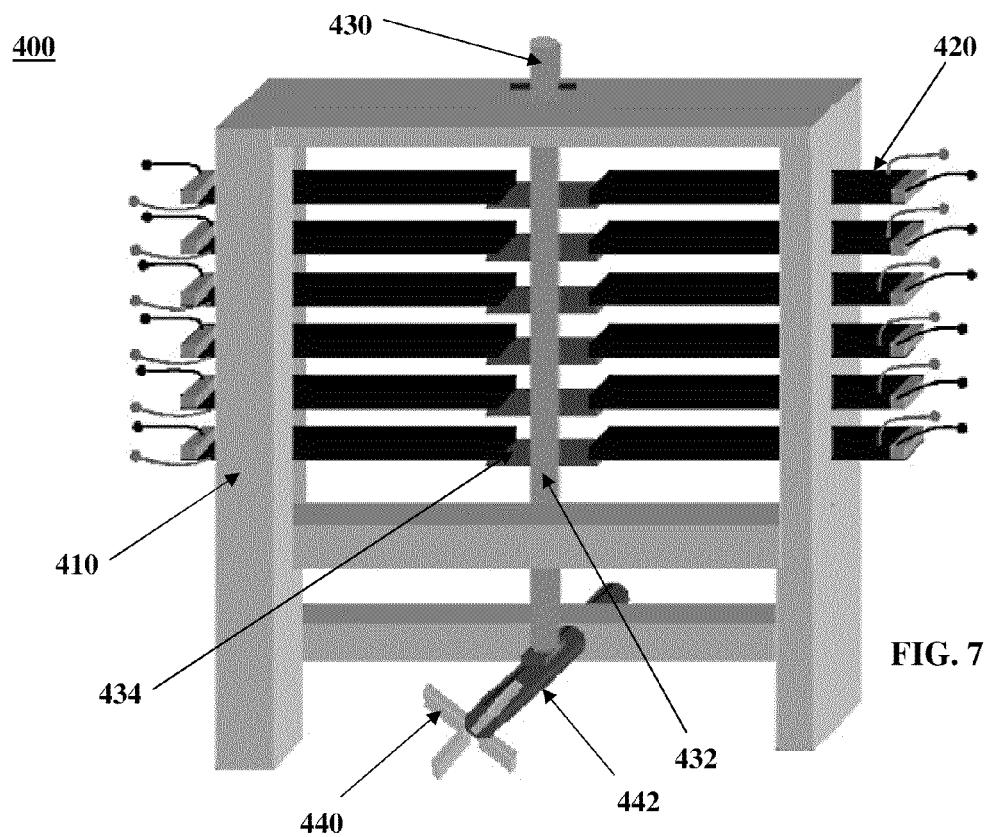
FIGS. 7A-C shows a representative electric energy generator, including (FIG. 7A) a schematic diagram with an arrangement of bimorph transducers, (FIG. 7B) is a picture of the piezoelectric windmill.
Figure 7B:
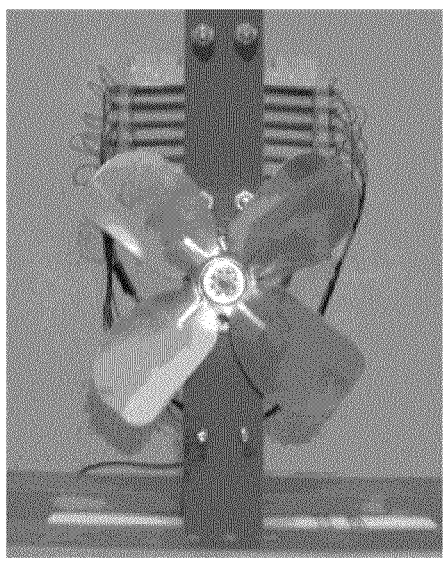
Figure 7C:
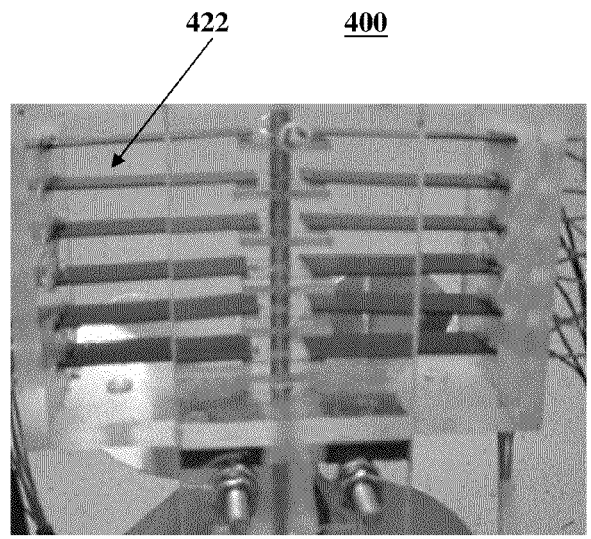

In another embodiment, the piezoelectric windmill 400 is shown in FIGS. 7A, 7B, and 7C. The piezoelectric windmill 400 is an extremely cost effective electric energy generator capable of converting wind energy into electric energy using piezoelectric bimorph actuators was prepared on a small scale. The total dimensions of this piezoelectric windmill 400 may be 5.08×11.6×7.7 cm$^3$, in one embodiment. A piezoelectric transducer was selected as the energy converter. The piezoelectric windmill 400 comprises a rectangular box-shaped body structure frame 410, a plurality of bimorph transducers 420 coupled to a cam-shaft mechanism 430. In one embodiment, twelve bimorph transducers were arranged in six rows and two columns separated from each other by a gap 422 of 6 mm through the slit. Slits were made on two opposite faces of the body so that two columns and six rows of bimorph actuators/transducers could be inserted. Each row of bimorph actuators was separated from each other by a gap of about 6 mm and the two columns of bimorphs were separated from each other by a gap of about 6.35 mm. The dimensions of each individual bimorph may be 60×20×0.6 mm$^3$ with a free length of 55 mm. In between the two columns a cylindrical rod 432 was inserted consisting of six rectangular hooks 434. The hooks 434 were positioned in such a way that each of them just touched the two bimorphs 420 on either side in a particular row. The resonance frequency and capacitance for each bimorph was measured to be 65 Hz and 170 nF, respectively. The displacement of the bimorph under the maximum stress was equal to the height of the cam. As the bimorph is pressed against the rectangular hook, it produces a charge through direct piezoelectric effect. Thus, continuous back and forth oscillation of bimorph will continuously generate electricity. The cylindrical rod bearings were designed to be with very low friction. The rectangular box with bimorph transducers and cylindrical rod was mounted on a central rotating shaft 442. At one end of the shaft 442, fan blades 440 were attached causing the shaft to rotate by the motion of the wind. The oscillating stress generated from the rotation of the fan 440 is transferred to the cylindrical rod 430 by using a cam of height 4 mm. The bimorphs produce output voltage proportional to the applied oscillating stress through piezoelectric effect. The piezoelectric windmill 400 may generate 1.2 mW power at a wind speed of 8.4 mph across a load of 1.7 kΩ, according to Equation (9).

Before the operation of the piezoelectric windmill, the bimorphs were pre-stressed to have a bending of 1.77 mm at the tip touching the hooks or the stopper. Output power increased with the pre stress level; the pre stress level may be adjusted such that the fan could be rotated easily in the normal wind flow conditions. Characterization of the generator was performed by blowing wind using a fan. Wind speed was measured using EA-3010U anemometer fitted at the top of the mill. The voltage was monitored on the HP 54601A digital 4-channel oscilloscope using HP 10071A probe. The impedance measurements were done using the HP 4194A analyzer. The capacitance and dielectric loss factor as a function of frequency was measured using HP 4275 LCR meter.

The effective electromechanical coupling factor ($k_{eff}$) of the generator in the free condition can be computed using the following relationship:

$$k_{eff} = \sqrt{1 - \left(\frac{f_r}{f_a}\right)^2}, \quad (10)$$

where $f_r$ and $f_a$ are resonance and anti-resonance frequencies. Using the values of $f_r$=669.25 Hz and $f_a$=743.5 Hz the magnitude of $k_{eff}$ was found to be 0.43. In the stressed condition, all the peaks in the resonance spectrum decreased significantly indicating the suppression of the vibration modes. At lower frequencies of less than 500 Hz, no peaks were observed in the impedance curve. For a typical mechanical vibration cycle, the input mechanical energy is transformed into electric energy with the ratio depending upon the square of the electromechanical coupling factor, $k_{eff}^2$=(stored electrical energy/input mechanical energy), and the remainder of unconsumed energy is stored as mechanical energy reduced by a factor dissipated as heat. In the present design, the magnitude of the $k_{eff}^2$ may be 0.185, in one embodiment.

In addition to $k_{eff}$, the other important parameters to be considered for the electromechanical transducer/actuator structure are dielectric loss factor (tan δ) and energy transmission coefficient, λ. At low frequencies, the loss of tan δ and capacitance was of the order of 2%. The loss was lower in the stressed condition as compared to free condition. The capacitance behavior as a function of the frequency showed a very discontinuous behavior, possibly related to the presence of mechanical vibration modes. The variation in the magnitude of the loss factor and capacitance corresponds to the changes in the impedance curve. Around the piezoelectric resonance, the magnitude of loss factor and capacitance increases. The sharp increase in the magnitude of loss factor at the frequency of 100 Hz in the stress-free condition may be associated with the leakage current from the interface between the epoxy and piezoelectric and soldering of wires.

The electromechanical coupling factor represents the square root of the ratio of the stored mechanical energy over input electrical energy. On the other hand, the transmission coefficient λ is the ratio of the mechanical output energy over input electrical energy or the electrical output energy over input mechanical energy, and it is a significant parameter for actuators. The relation between the electromechanical coupling factor and the maximum transmission coefficient is given by:

$$\lambda_{max} = \left(\frac{1}{k} - \sqrt{\frac{1}{k^2} - 1}\right)^2. \quad (11)$$

Using the magnitude of $k_{eff}$ as 0.43, the value of $\lambda_{max}$ was found to be 0.05. The magnitude of the matching load (the resistive load at which power is maximum) is dependent on various parameters, including the damped output capacitance, capacitance change with prestress, dielectric loss factor, impedance of the rectification circuit, and changes due to structural assembly. Neglecting all the other factors, the matching load can be approximated as:

$$\text{Theoretical Matching Load} = \frac{1}{2\pi f \cdot C_{damped}}, \quad (12)$$

which for the present case comes out to be about 1 kΩ. This magnitude of the matching impedance is in good range for incorporating it with the charging circuits. A low magnitude of the matching load is required because the batteries or other external devices have impedances of the order of a few tens of ohms The efficiency (η) of the transducer, governed by the mechanical and dielectric losses, is given by the relation:

$$\eta = \frac{\text{Output Electrical energy}}{\text{ConsumedInput Mechanical energy}}. \quad (13)$$

With a piezoelectric ceramic composition of one embodiment, the efficiency usually reached was 95%. For a typical mechanical vibration cycle, the input mechanical energy is transformed into electrical energy with the ratio depending upon the square of the electromechanical coupling factor (0.185 in the present case), and the remainder unconsumed energy is stored as mechanical energy with a slight dissipated energy as heat. However, the actual efficiency is less since not all harvested energy is transformed into electrical energy.

With the generator described above, the voltage level and signal waveform depend on the design parameters and electric load used in the circuit. The average power across a resistor (R) was calculated using the relation $V^2/(2.R)$. At the frequency of 8 Hz and matching load of 670Ω, the generated electrical power was found to be 0.96 mW.

At a given wind speed the frequency of the oscillation saturated and the power attained a constant magnitude. The power increased with increasing wind speed which is related to the increment in the frequency. The variation of the power as a function of the frequency was linear variation, which is when a bimorph at low frequencies behaves like a capacitor. The cut-in wind speed (threshold wind speed required to start the windmill) was found to be 4.7 mph and cut-out wind speed (maximum wind speed above which structural problems may occur) was found to be 14 mph. The rated wind speed was found to be 12 mph providing a constant power of 1.2 mW demonstrating the effectiveness of this small-scale piezoelectric generator.

As before, the electrical energy generated by the generator described herein may be stored in, for example, the capacitor or miniaturized Li-batteries. The generated energy is then available to power a number of items requiring power, such as sensing, optical, and electrical devices. The power is readily controlled by adjusting the number of bimorph actuators in the generator.

In still another example, compositions of one embodiment provide for piezoelectric transformers, such as multi-layer piezoelectric transformers that have one direction poling (are unipoled) or more than one direction poling. The transformers may operate in a wide-frequency range and deliver both step-up and step-down voltages with high power. In one example, piezoelectric ceramic compositions of one embodiment may be fabricated as transformer, such as disks of diameter 29.1 mm for lighting lamps up to 10 W and 40 mm for lighting the lamp of 32 W. The electrode pattern is a ring/dot structure, where a strip connects the dots. In one form, the transformer works in the fundamental radial mode to yield high power and efficiency. Such a transformer with optimized electrode pattern may provide a power density of at least about 40 W/cm. Multilayering of the unipoled transformers may be equivalent to connecting the transformer in parallel.

I. Windmill Utilizing Magnetic Displacement

Figure 8A:
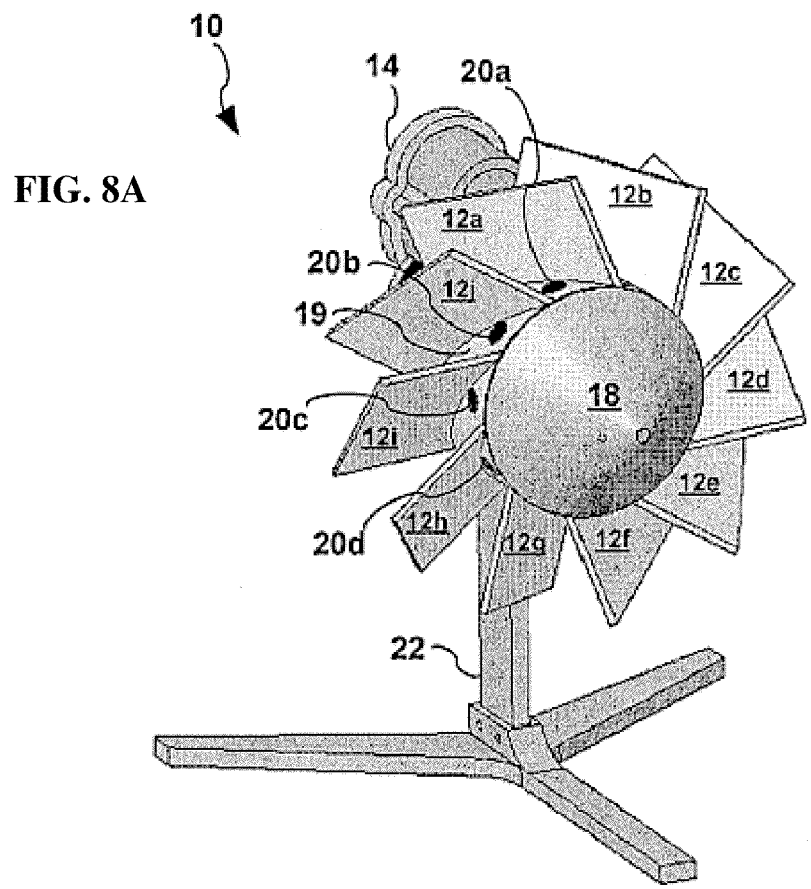
FIG. 8A is a perspective view of a piezoelectric windmill according to one embodiment.
Figure 8B:
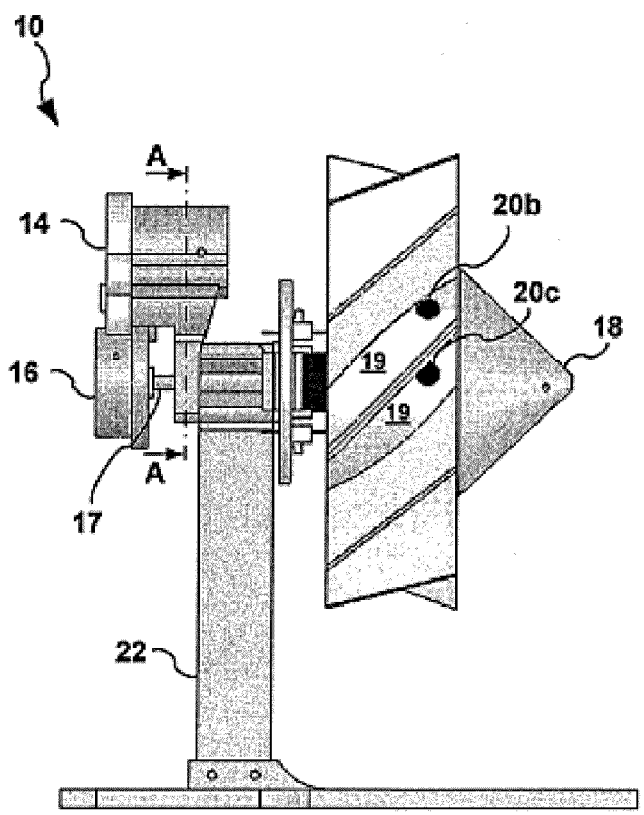
FIG. 8B is a side view of the piezoelectric windmill shown in FIG. 8A according to one embodiment.

Referring to FIGS. 8A-8D, a piezoelectric windmill 10 according to an alternative embodiment is shown. The piezoelectric windmill 10 comprises a conventional electromagnetic generator 14 and a piezoelectric generator 30 coupled to a rotatable portion 19 via a shaft 17, wherein the shaft is rotatably coupled to a pole 22, as shown in FIG. 8B. Piezoelectric generators 30 employ piezoelectric bimorphs to convert mechanical stress into an electric field, as previously indicated. The electromagnetic generator 14 is a device that converts mechanical energy to electrical energy, generally using electromagnetic induction. Two or more blade members 12a-12j are mounted on the rotatable portion 19 of the exterior of the piezoelectric windmill 10. Rotatable portion 19 also includes two or more magnetic portions 20a-20d spaced at even intervals along the perimeter or circumference of the rotatable portion 19. The rotatable portion 19 may include a cup or cone-like face to deflect wind to the blade members, wherein the piezoelectric generator 30 is contained with a front portion 18 of the rotatable portion 19.

Figure 8C:
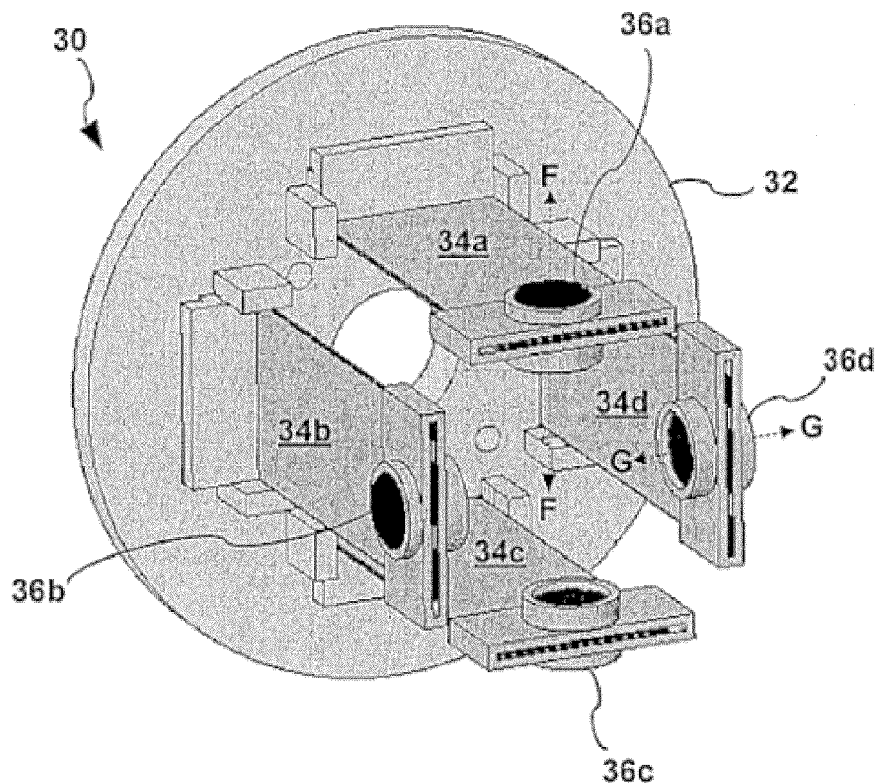
FIG. 8C is a perspective view of a generator adapted for use by the piezoelectric windmill shown in FIG. 8A according to one embodiment.
Figure 8D:
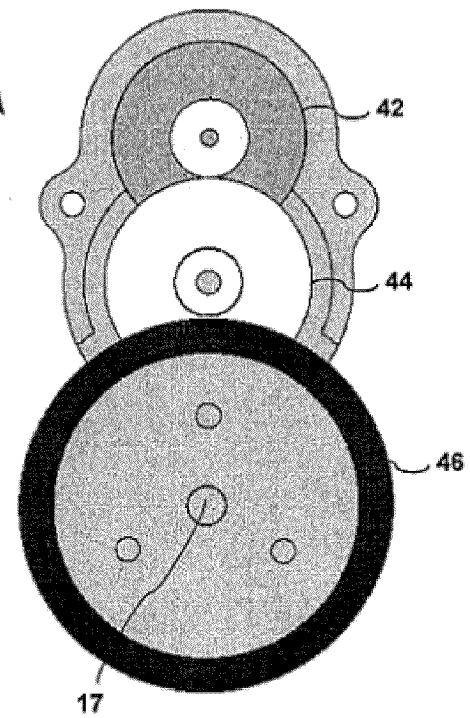
FIG. 8D is a cross-sectional view of the piezoelectric windmill shown in FIG. 8A at A-A illustrating a two step gear train according to one embodiment.

In one embodiment, the magnetic portions 20a-20d consist of eighteen magnets positioned every ten degrees along the perimeter of the rotatable portion 19. Each of the magnetic portions 20a-20d is arranged in an alternating magnetic pole (e.g., magnetic portion 20c has the same magnetic pole as magnet portion 20a, and an opposite magnetic pole as magnet portions 20b and 20d). As shown in FIG. 8D, the electromagnetic generator 14 is connected to shaft 17 via a two step gear train 40 including a driving gear 42, a transfer gear 44, and a driving gear 46 rotatably coupled to the shaft 17. It is to be understood, however, that other connections are possible within the scope of one embodiment as to provide sufficient rotational coupling. The two or more blade members 12a-12j produce a rotational force by capturing wind flows at small velocities. The rotational force is transferred to a conventional gearing and bushing unit 16 and to the electromagnetic generator 14 via shaft 17. Techniques for transferring rotational force to an electromagnetic generator via a shaft are well known in the art.

As shown in FIG. 8B, the piezoelectric generator 30 is contained within the front portion 18 of the piezoelectric windmill 10. As shown in FIG. 8C, the piezoelectric generator 14 includes four piezoelectric bimorphs 34a-34d. Each of the piezoelectric bimorphs 34a-34d includes a respective magnetic portion 36a-36d. Each of the magnetic portions 36a-36d of the piezoelectric bimorphs 34a-34d is arranged in alternating magnetic poles. The magnetic portions 36a-36d of the piezoelectric bimorphs 34a-34d are arranged to magnetically interact with the magnetic portions 20a-20d of the rotatable portion 19. As the rotatable portion 19 is rotated, the magnetic portions 36a-36d of the piezoelectric bimorphs 34a-34d experience inward and outward magnetic forces as each of the magnetic portions 36a-36d comes into alignment with a respective magnetic portion 20a-20d of the rotatable portion 19. The piezoelectric bimorphs 34a-34d are thus subjected to periodically varying forces in the F and G directions as the rotatable portion 19 is rotated. Such varying forces resulting in each of the piezoelectric bimorphs 34a-34d providing a voltage.

Optimally, the materials utilized in the piezoelectric windmill 10 are inexpensive. In one embodiment, the structure of the piezoelectric windmill 10 substantially consists of plastic parts. The dimension of each piezoelectric bimorph 34a-34d is 60×20×0.6 mm$^3$ (width×length×height) with a free length of 53 mm. The resonance frequency and capacitance for this size of piezoelectric bimorph 34a-34d were measured to be 65 Hz and 170 nF, respectively, in free condition. Alternatively, the piezoelectric windmills 300 and 400 may be coupled to the electromagnetic generator 14 as detailed herein.

II. Vertical Windmill with Cup Vanes Embodiment

Figure 9A:
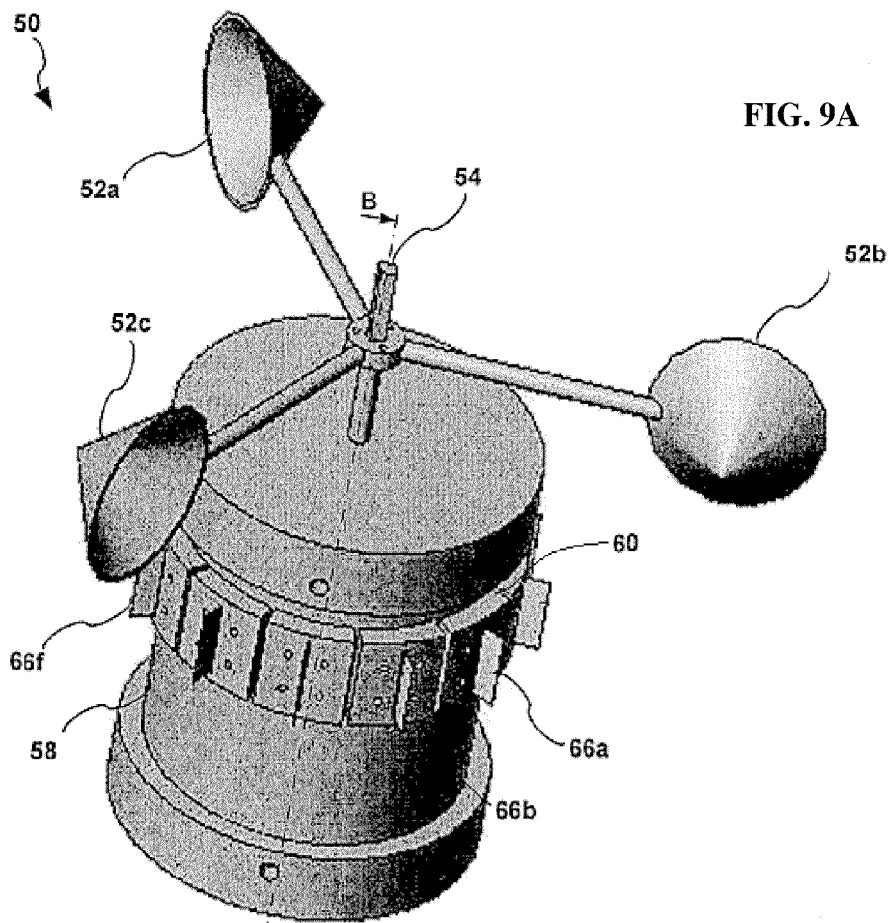
FIG. 9A is a perspective view of a piezoelectric windmill according to another embodiment one embodiment.
Figure 9B:
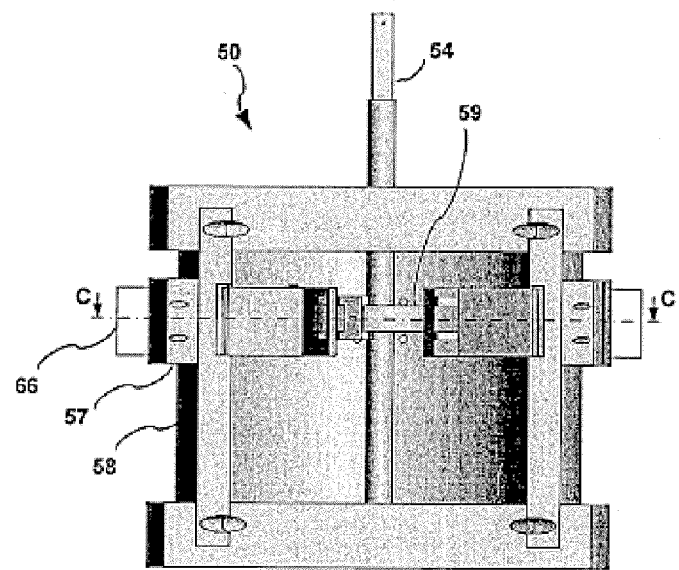
FIG. 9B is a cross-sectional view of the piezoelectric windmill shown in FIG. 2A at B-B according to one embodiment.
Figure 9C:
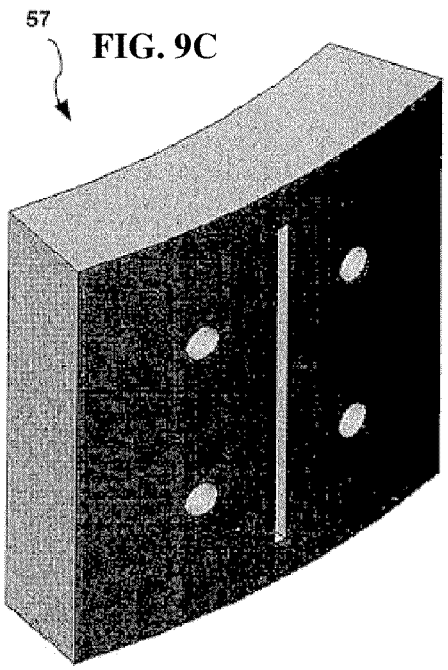
FIGS. 9C and 9D are exploded views of a coupling member and a piezoelectric bimorph according to one embodiment.
Figure 9D:
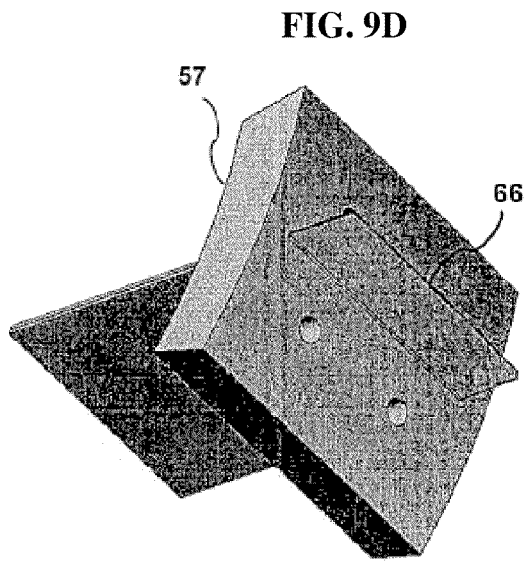
Figure 9E:
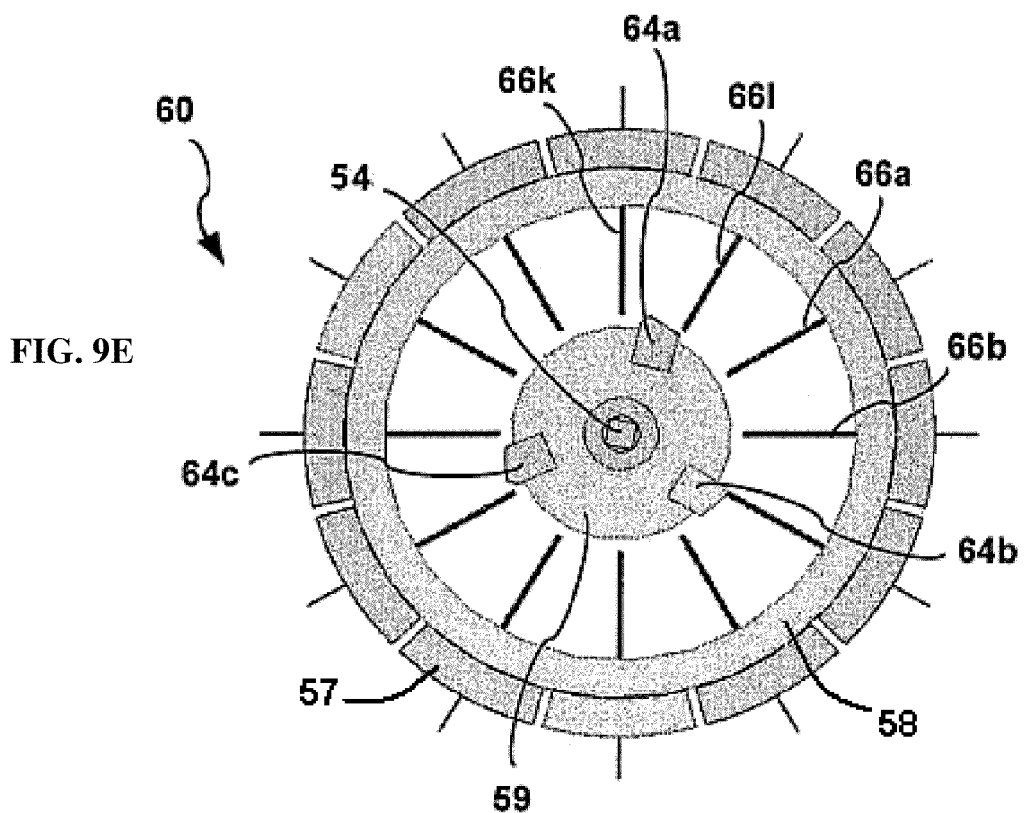
FIG. 9E is a cross-sectional view of the piezoelectric windmill shown in FIGS. 9A and 9B at C-C illustrating piezoelectric bimorphs along the according to one embodiment.

Referring to FIGS. 9A-9E, a piezoelectric windmill 50 according to another embodiment is shown. The piezoelectric windmill 50 includes a conventional electromagnetic generator (not shown) and a piezoelectric generator 60 within a columnar tube 58. As shown in FIG. 9A, the piezoelectric windmill 50 utilizes two or more cup vanes 52a-52c to generate a rotational force along a shaft 54. The shaft 54 transfers the rotational force to the piezoelectric generator 60 through a circular disc 59 fixedly associated with the shaft 54. The piezoelectric generator 60 includes two or more protrusions 64a-64c fixedly associated with the circular disc 59 and two or more piezoelectric bimorphs 66a-66b operationally coupled to the protrusions 64a-64c, as shown in FIG. 9E. The two or more piezoelectric bimorphs 66 are arranged along the circumference of the columnar tube 58 with a plurality of clamps 57. As shown in FIGS. 9C and 9D, the clamps 57 include a slot for the piezoelectric bimorphs 66 and holes to removably associate the clamps with the columnar tube 58. The two more protrusions 64a-64c are circumferentially arranged on the same rotational plane as the two or more piezoelectric bimorphs 66 and interior to the two or more piezoelectric bimorphs 66, such that as the piezoelectric generator 60 is rotated, the protrusions 64a-64c repeatedly contact the two or more piezoelectric bimorphs 66. The mechanical force resulting from the repeated contact by the protrusions 64a-64c causes the two or more piezoelectric bimorphs 66 to vibrate which generates electric voltage.

In one embodiment, the cup vanes 52a-52c have a diameter of 2.3 inches, a depth of 1.2 inch and an arm length of 3.5 inches. Twelve piezoelectric bimorphs 66 are epoxied along the circumference of the piezoelectric windmill 50 using removable clamps for easy replacement. Each of the piezoelectric bimorphs 66 can be prestressed and positioned accurately from outside the piezoelectric windmill 50. As the cup vanes 52a-52c rotate the shaft 54, three triangular protrusions 64a-64c on the piezoelectric generator 60 repeatedly contact the piezoelectric bimorphs 66 at approximately every 10' or every 6-8 degrees. The continuous power produced from the piezoelectric windmill 50 was determined to be 4.5 µW across 240 KΩ at average wind speeds of 10 miles/h. The power was measured across the load connected in parallel to a 111 bridge rectifier and capacitor. Wind speed was measured using an EA-3010U anemometer and the output voltage was monitored via a HP 54601A digital four-channel oscilloscope using HP 10071A probe.

III. Vertical Windmill with Traditional Blades Embodiment

Figure 10A:
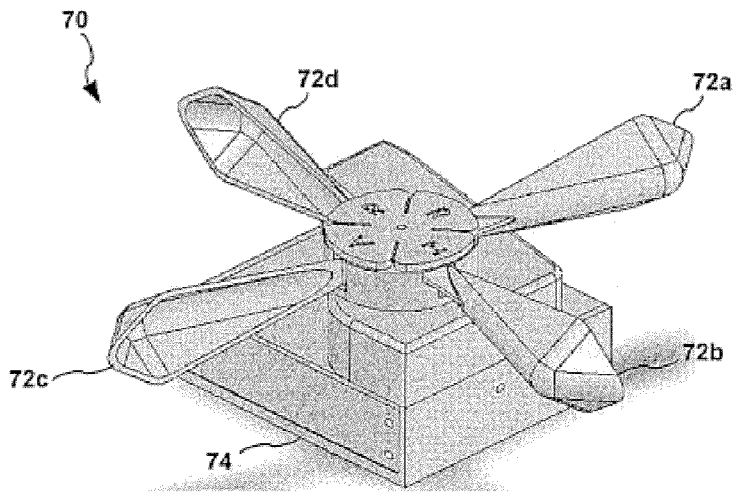
FIG. 10A is a perspective view of a piezoelectric windmill according to a further embodiment one embodiment.
Figure 10B:
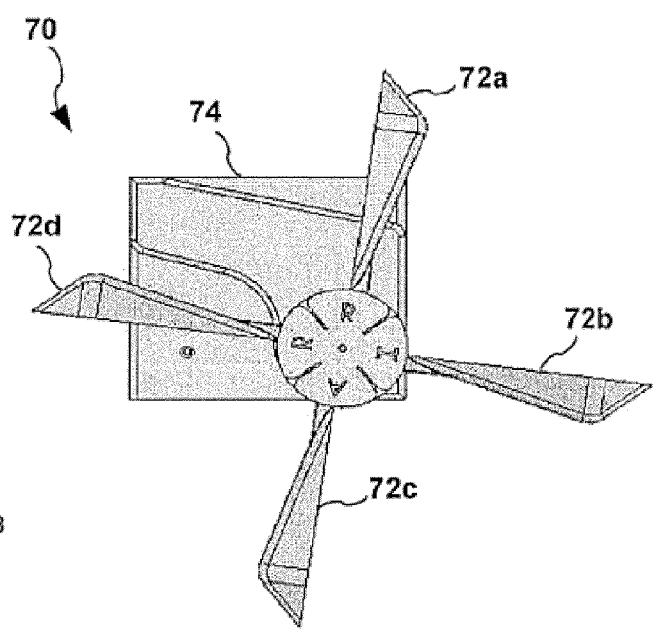
FIG. 10B is a top view of the piezoelectric windmill shown in FIG. 10A according to one embodiment.
Figure 10C:
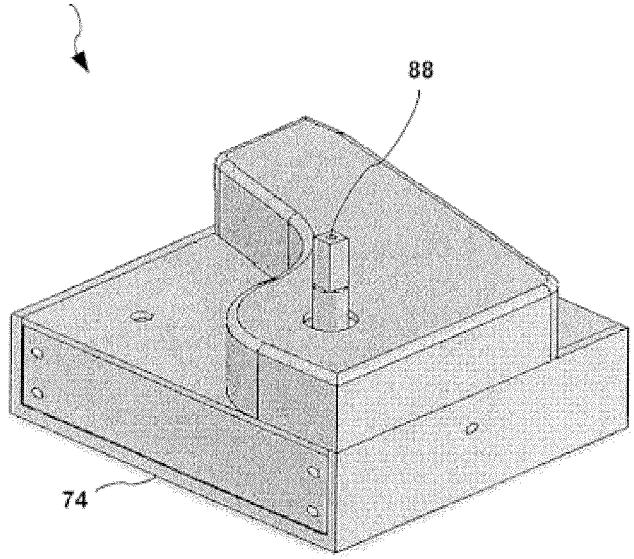
FIG. 10C is a perspective view of the piezoelectric windmill shown in FIG. 10A without the blade members according to one embodiment.
Figure 10D:
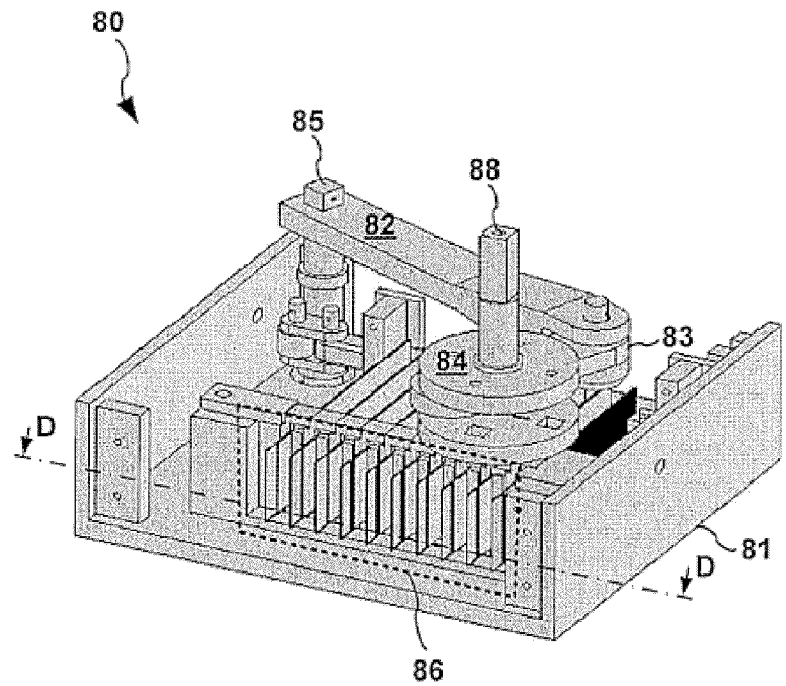
FIG. 10D is a cutaway perspective view of the piezoelectric windmill shown in FIG. 10A illustrating internal components according to one embodiment.
Figure 10E:
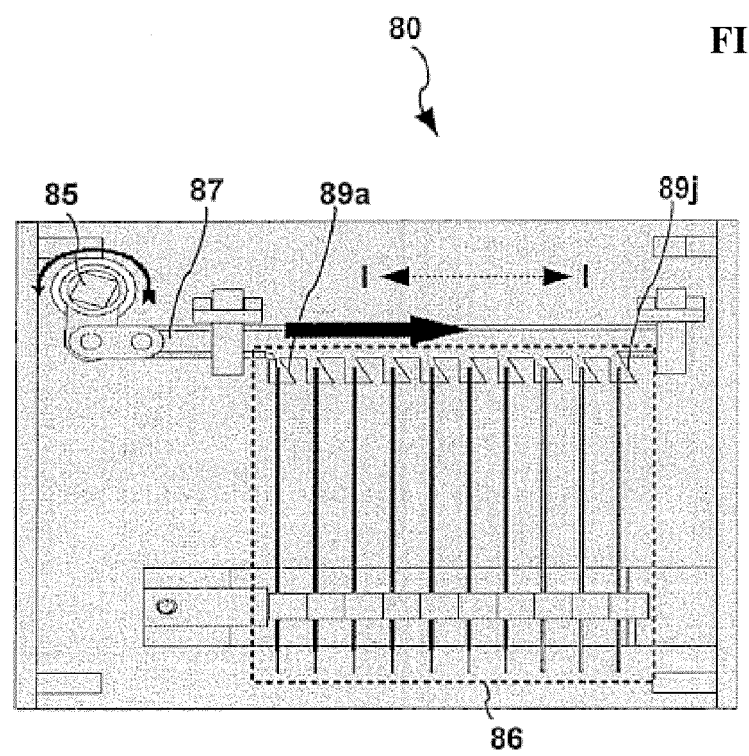
FIG. 10E is a cross-sectional view of the piezoelectric windmill shown in FIG. 10D at D-D illustrating an intermediate shaft as it transfers the motion to an arm that deflects the piezoelectric bimorphs according to one embodiment.
Figure 10F:
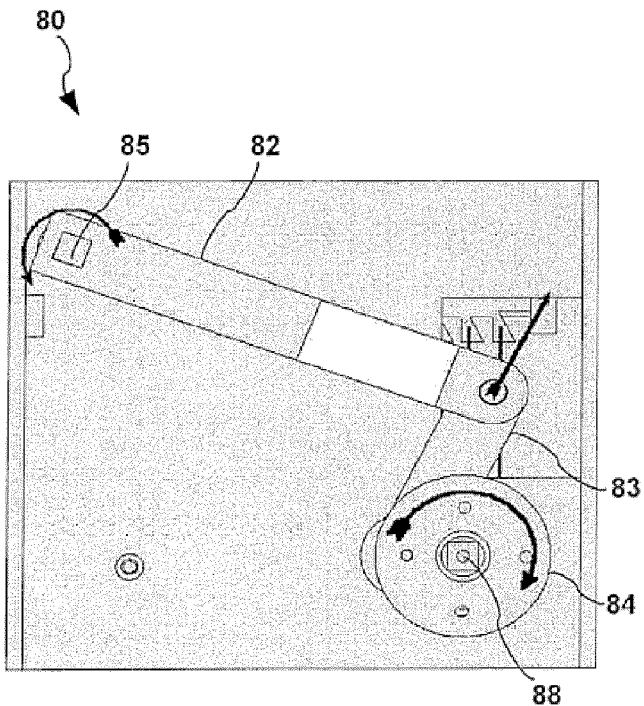
FIG. 10F is a top view of the crank arm as it is changing direction as the circular disc rotates.

Referring to FIGS. 10A-10F, a piezoelectric windmill 70 according to a further embodiment is shown. The piezoelectric windmill 70 includes a conventional electromagnetic generator (not shown) and a piezoelectric generator 80. The piezoelectric windmill 70 utilizes two or more blade members 72a-72d to generate a rotational force along an internally mounted shaft 88 with a crank arm 83 attached to the shaft 88, as shown in FIG. 10D. The crank arm 83 is fixedly associated with a circular disc 84 to mechanically move the crank arm 83 and a first bar 82, such that an intermediate shaft 85 is rotated, as shown in FIG. 10F. As shown in FIG. 10E, the intermediate shaft 85 is connected to a second bar 87 which is attached at connecting portions 89a-89j to each piezoelectric bimorph of a bimorph group 86, such that as the two or more blade members 72a-72d rotate, the crank arm 82 movement results in the second bar 87 repeatedly stressing each piezoelectric bimorph 89a-89j of the bimorph group 86 in the I direction. Each piezoelectric bimorph 89a-89j is fixedly stabilized on the opposite end of the repeated stress. The mechanical force resulting from the repeated stress by the second bar 87 causes each piezoelectric bimorph 89a-89j of the bimorph group 86 to vibrate which generates electric voltage. The mechanical force on the piezoelectric bimorphs can be adjusted by changing the lever arm ratio.

In one embodiment, the dimension of the piezoelectric windmill 70 windmill is $3.78 \times 4.2 \times 2.6$ inches$^3$ (width $\times$ length $\times$ height) without the blade members 72a-72d mounted. The structure of the piezoelectric windmill 70 may be composed of acrylonitrile butadiene styrene ("ABS") plastic. The bimorph group 86 includes nine piezoelectric bimorphs arranged in parallel with respect to each other, in one embodiment. The piezoelectric windmill 70 includes four horizontally mounted 4 inch blade members 72a-72d with a surface area of 4.25 inch$^2$ and a depth of 0.8 inch. The blade members 72a-72d were specially designed using three-dimensional stereolithography to allow the differential flow of wind from one end to the other end assisting the motion. An approximate measurement of the drag coefficient was conducted to optimize the curvature of the blade members 72a-72d. The blade members 72a-72d rotate an internally mounted shaft 88 with a crank arm 83 attached to it. The crank arm 83 movement results in the second bar 87 stressing the nine piezoelectric bimorphs of the bimorph group 86. Random wind flow is converted into sinusoidal mechanical motion through the use of the rotating shaft 88 and the crank arm 83. Each of the piezoelectric bimorphs 89a-89j of the bimorph group 86 are deflected at the tip to a maximum distance of 0.08 inch. Each of the piezoelectric bimorphs 89a-89j were determined to move synchronously, thereby, allowing the signal from each of the piezoelectric bimorphs to be combined without requiring additional processing circuits. The continuous power generated from the piezoelectric windmill 70 was determined to be 0.2 mW across 30 k$\Omega$ at average wind speeds of 10 miles/h.

IV. Small Scale Windmill with Three Blades Embodiment

Figure 11A:
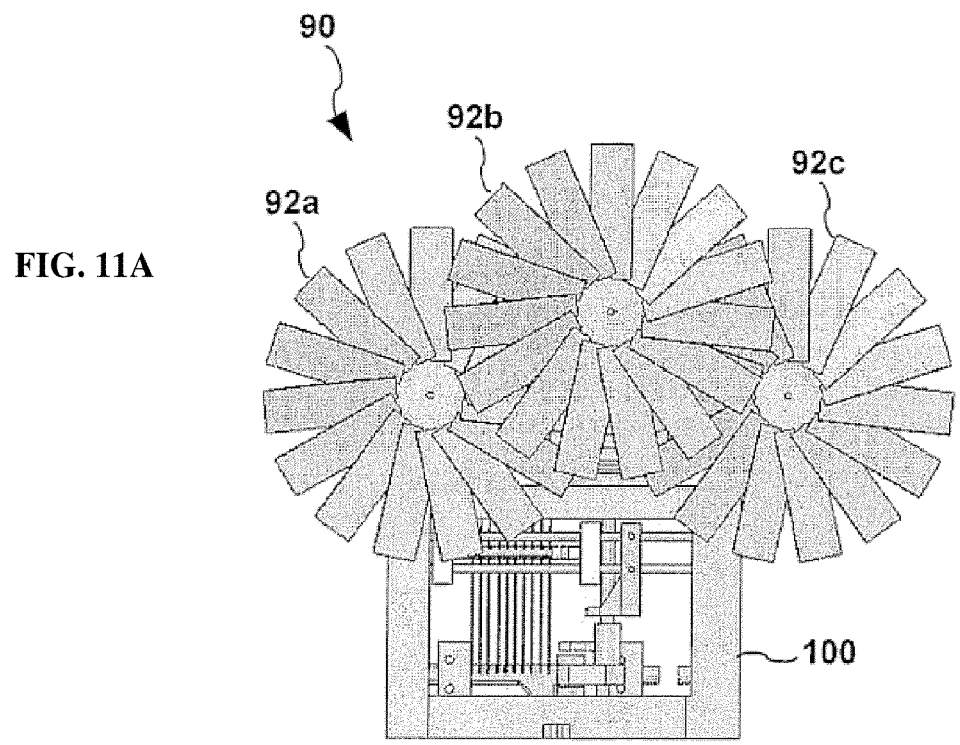
FIG. 11A is a front view of a piezoelectric windmill according to yet another embodiment one embodiment.
Figure 11B:
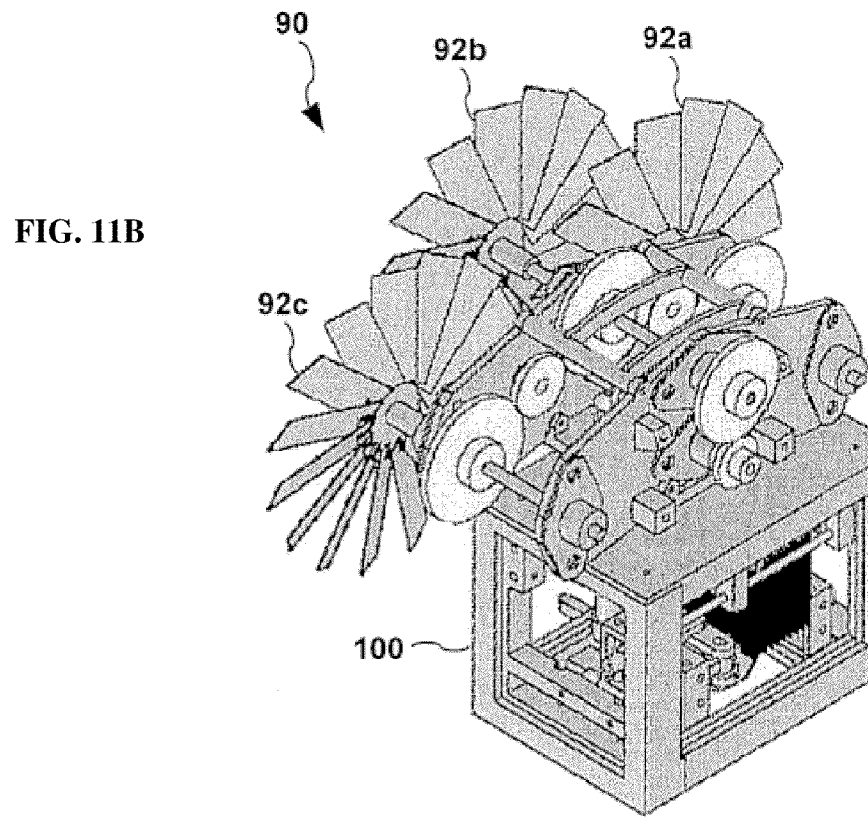
FIG. 11B is a rear perspective view of the piezoelectric windmill shown in FIG. 11A according to one embodiment.
Figure 11C:
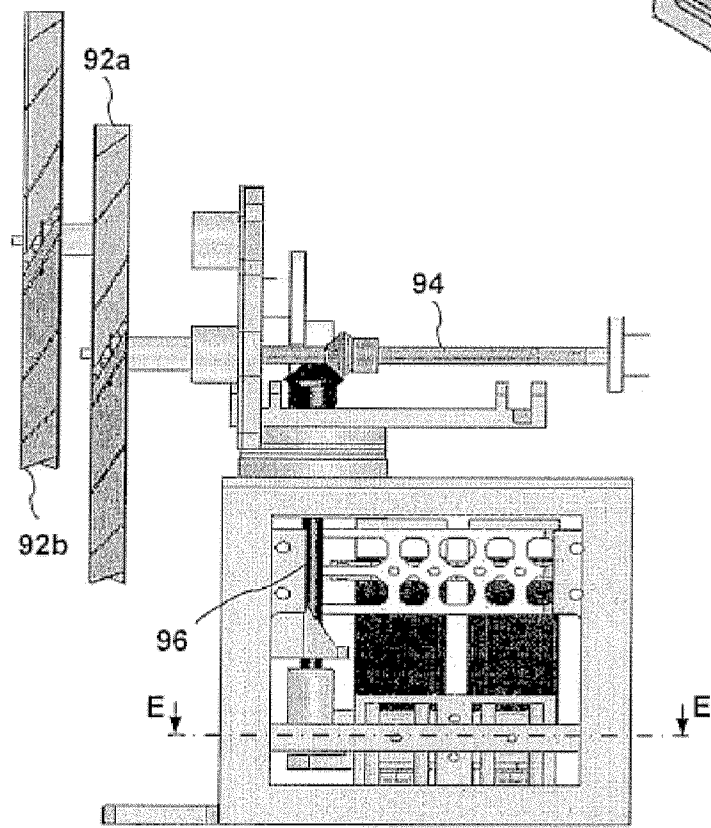
FIG. 11C is cutaway side view of the piezoelectric windmill shown in FIG. 11A according to one embodiment.
Figure 11D:
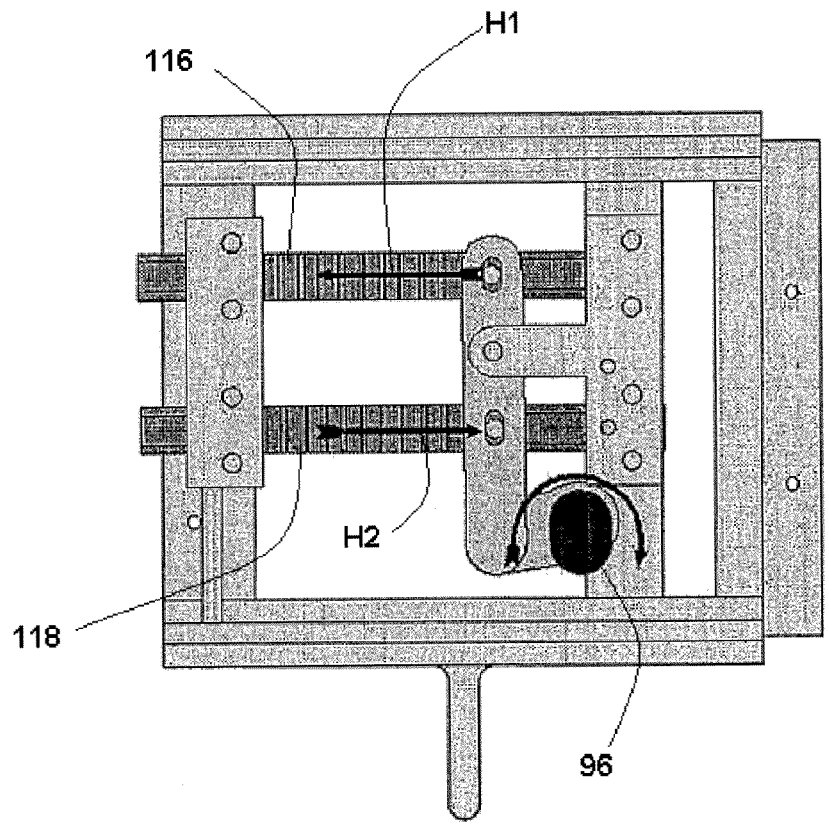
FIG. 11D is a cross-sectional view of the piezoelectric windmill shown in FIGS. 11A and 11D at E-E according to one embodiment.
Figure 11E:
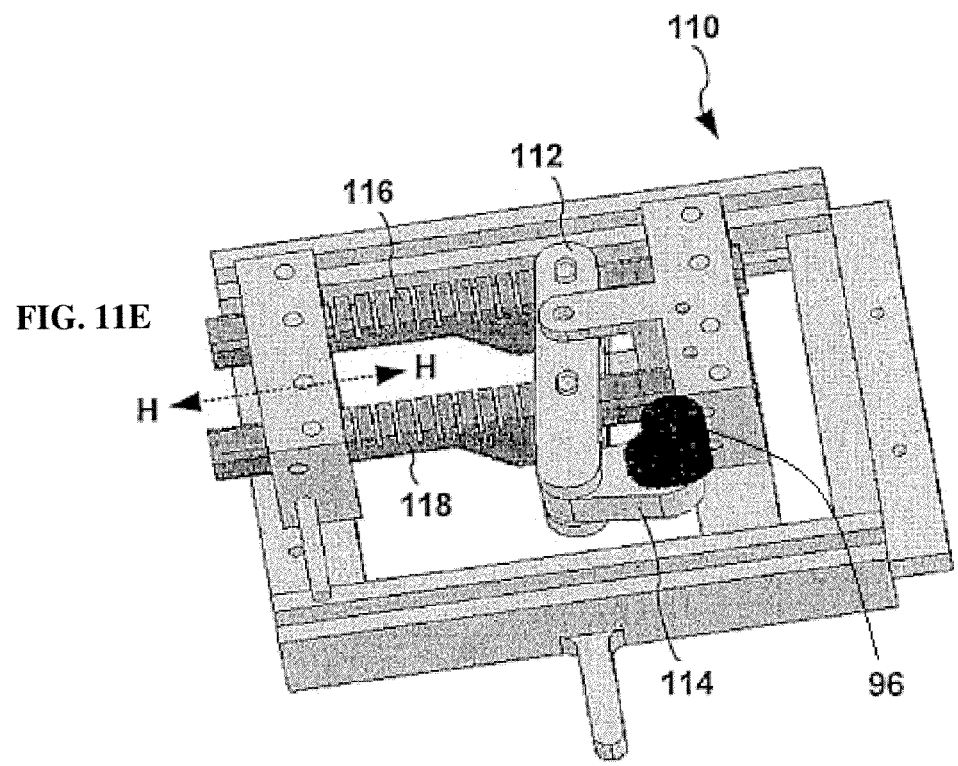
FIG. 11E is a cross-sectional view of the piezoelectric windmill shown in FIGS. 11A and 11D at E-E according to one embodiment.
Figure 11F:
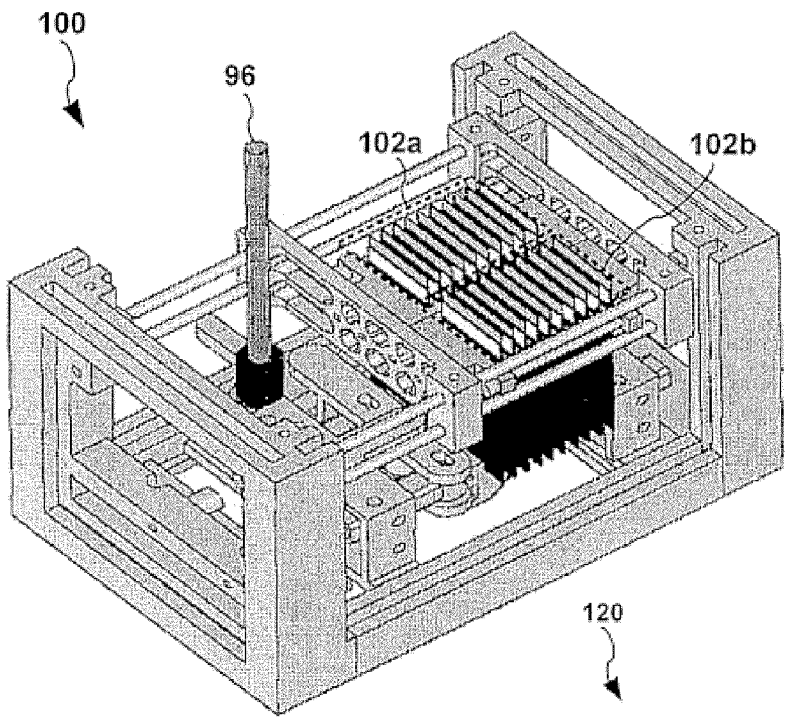
FIG. 11F is cutaway perspective view of the piezoelectric windmill shown in FIG. 11A according to one embodiment.

Referring to FIGS. 11A-11F, a piezoelectric windmill 90 according to yet another embodiment is shown. The piezoelectric windmill 90 includes a conventional electromagnetic generator (not shown) and a piezoelectric generator 100. The piezoelectric windmill 90 also includes at least one fan 92a-92c. Each of the fans 92a-92c includes two or more blade members. The piezoelectric generator 100 includes two bimorph groups 102a and 102b, as shown in FIG. 11F. Each of the piezoelectric bimorphs groups 102a and 102b includes two or more piezoelectric bimorphs configured to convert mechanical stress into a voltage. The fans 92a-92c are configured to provide a rotational force along a first shaft 94 and a second shaft 96, as shown in FIG. 11C. The first shaft 94 is rotationally coupled to the second shaft via a gear mechanism. A crank arm 114 is attached to the second shaft 96, as shown in FIG. 11E. The crank arm 114 mechanically moves a bar 112 which is attached via connecting portions 116 and 118 to each piezoelectric bimorph of the bimorph groups 102a and 102b, such that as the fans 92a-92c rotate, the bar 112 repeatedly stressing each piezoelectric bimorph of the bimorph groups 102a and 102b in the H direction, as shown in FIG. 11E. The mechanical force resulting from the repeated stress by the bar 112 causes each piezoelectric bimorph of the bimorph groups 102a and 102b to vibrate which generates electric voltage. Alternatively, as shown in FIG. 11D, the two sets of connecting portions 116 and 118 are moved in opposing directions H1 and H2 by bar 112 and the two sets of bimorphs 102a and 102b oppose each other to reduce force needed to deflect the bimorphs.

In one possible embodiment, the piezoelectric windmill 90 utilizes three separate fans 92a-92c to enhance the AC stress and to capture the wind flow. Each of the fan 92a-92c include two or more blade members, each having a diameter of 5 inches. The larger surface area enables the two or more blade members to capture more wind flow. The horizontal blade members offer greater efficiency because both sides of the blade members are configured to capture wind power, whereas a vertical blade member has to push one side of the blade against the wind at all times. The structure of the piezoelectric windmill 90 is composed of ABS plastic with a total size of $3 \times 4 \times 5$ inches$^3$. The inner structure of the piezoelectric windmill 90 includes a crank assembly 110 that includes a vertical shaft connected to a lever arm to convert the rotational force into a translation motion. Each of the fans 92a-92c are connected into the single vertical shaft through an adjustable gear ratio, which is adjustable as to optimize frequency. The piezoelectric generator 100 includes two bimorph groups 102a and 102b which are arranged as two rows of piezoelectric bimorphs, mentioned here as front and back rows, where each row has nine piezoelectric bimorphs. The number of the piezoelectric bimorphs was selected by analyzing the force-displacement load line curve where the optimum point approximately corresponds to 50% reduction in available force. The frequency of the piezoelectric windmill 90 may be easily adjusted by changing the gear ratio. The translation distance of the piezoelectric bimorphs may be adjusted by swapping the crank at the end of the pulling m. The piezoelectric windmill 90 has several advantages including, without limitation, (i) two bimorph groups 102a and 102b that oppose each other, such that the force needed to deflect the piezoelectric bimorphs is reduced, (ii) an adjustable gear ratio configured to allow a user to optimize the frequency, (iii) a simultaneously adjusting pretension on all piezoelectric bimorphs, (iv) two or more blade members having large surface areas configured to capture more wind flow, and (iv) a higher rotational inertia to prevent the piezoelectric windmill 90 from cogging which would require more energy to overcome static friction.

V. Blades Designs

Figure 12A:
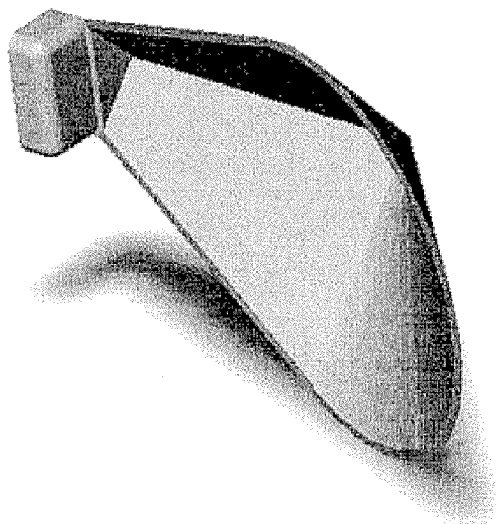
FIGS. 12A and 12B are perspective views of different blade shapes adapted for use by the piezoelectric windmills shown in FIGS. 9A, 10A and 11A to capture wind flows at small velocities according to one embodiment.
Figure 12B:
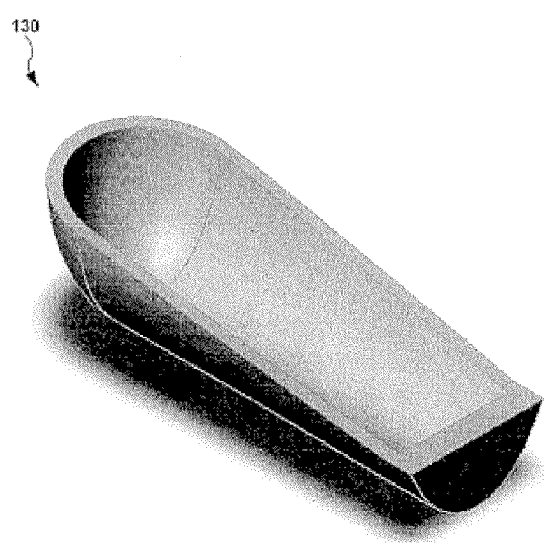

Referring to FIGS. 12A and 12B, perspective views of different blade shapes adapted for use by the piezoelectric windmills are shown in FIGS. 9A, 10A and 11A to capture wind flows at small velocities according to one embodiment.

Figure 12C:
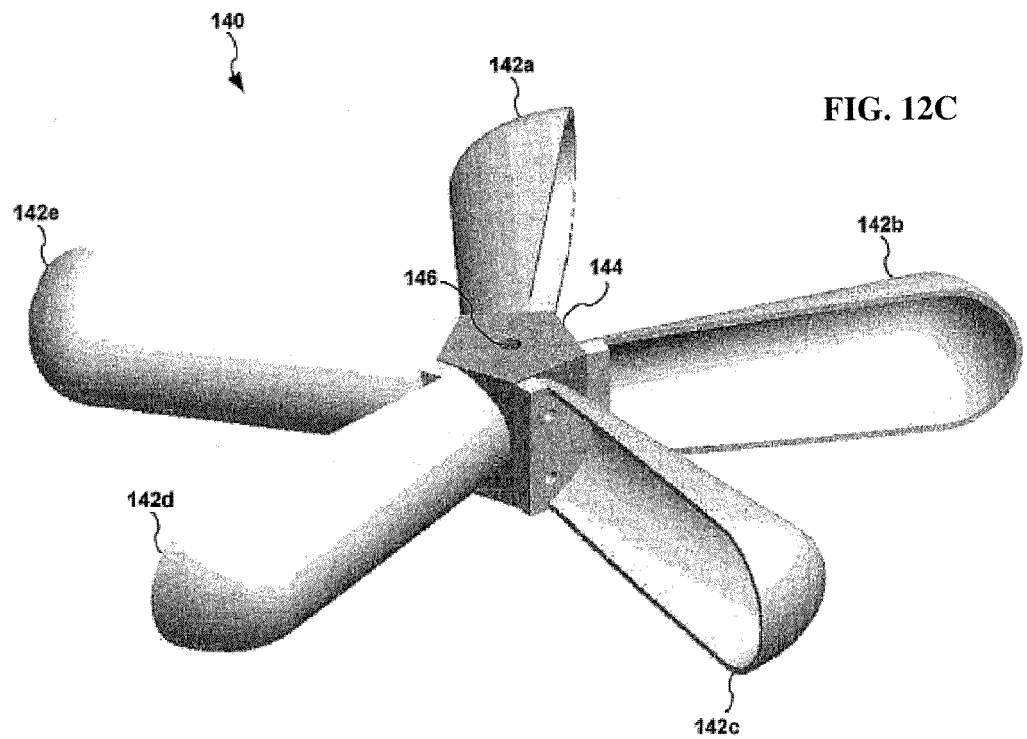
FIG. 12C is a perspective view of a windmill fan adapted for use by the piezoelectric windmills shown in FIGS. 9A, 10A and 11A to capture wind flows at small velocities according to one embodiment.
Figure 13:
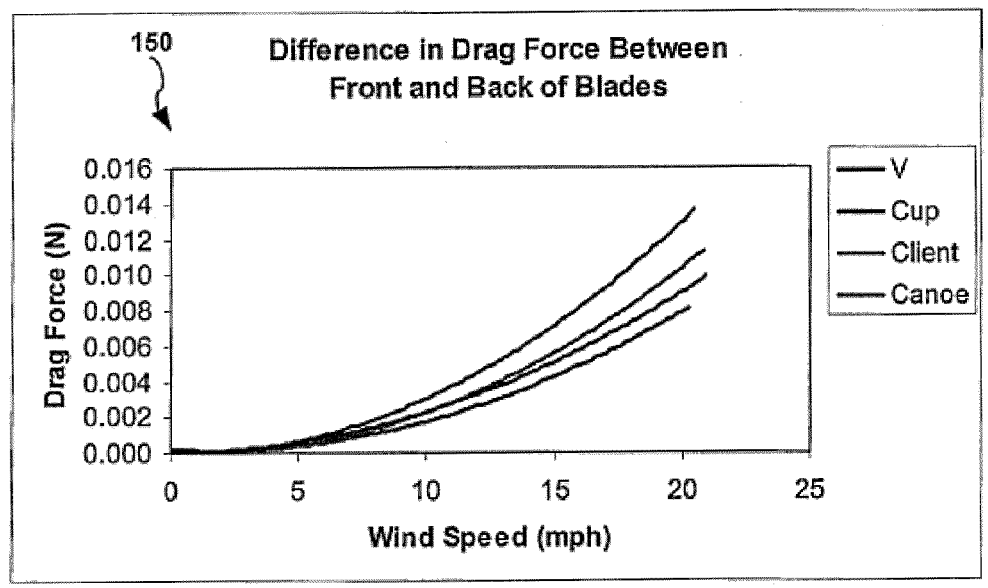
FIG. 13 is a chart illustrating the drag force of different blade shapes adapted for use by the piezoelectric windmill shown in FIG. 11A according to one embodiment.

Additionally, FIG. 12C shows a perspective view of a windmill fan 150 adapted for use by the piezoelectric windmills shown in FIGS. 9A, 10A and 11A to capture wind flows at small velocities according to one embodiment. The different blade shapes shown in FIGS. 12A and 12B were designed to more efficiently capture more wind flow and to reduce the effect of drag. A chart illustrating the drag force of the different blade shapes adapted for use by the piezoelectric windmill 90 is shown in FIG. 13.

VI. Power Output

Figure 14:
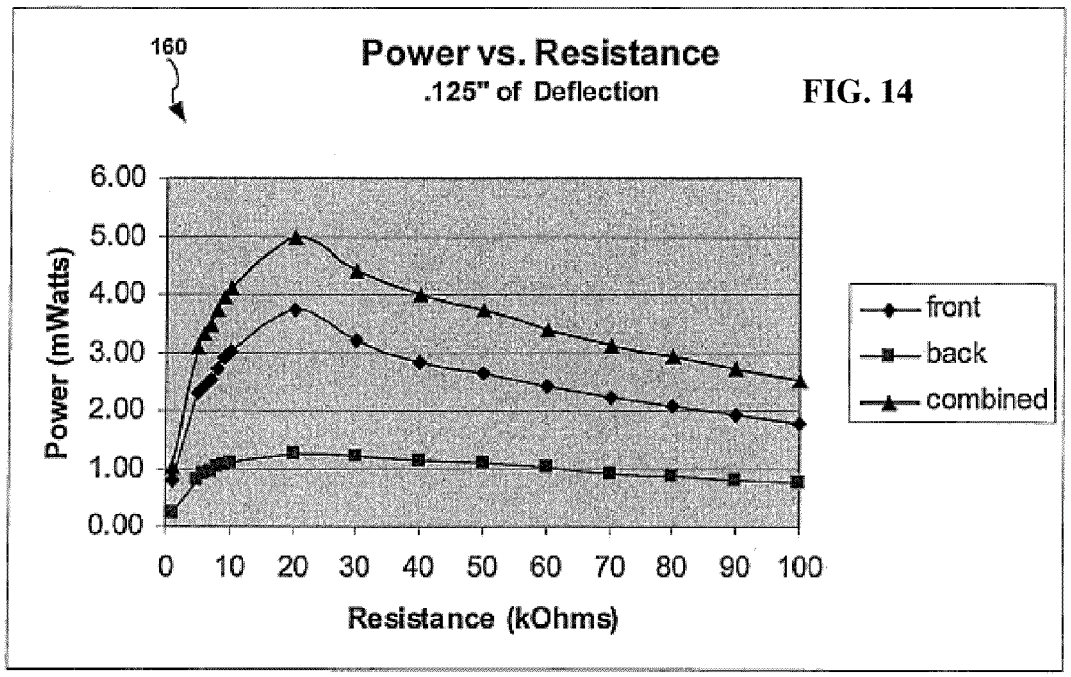
FIG. 14 is a chart illustrating the power to resistance ratio for the piezoelectric bimorphs shown in FIGS. 11A-11C according to one embodiment.

Referring to FIG. 14, a chart illustrating the power to resistance ratio for the piezoelectric bimorphs shown in FIGS. 11A-11C according to one embodiment is shown. The combined power from the front and back rows of the bimorph groups 102a and 102b was determined to be 5 mW at a translation distance or puller arm deflection of 0.125 inch. The combined power from the front and back rows of the bimorph groups 102a and 102b was also determined to be of the order of 2 mW at a translation distance of 0.100 inch (chart not shown). The testing was performed with an average wind speed of 10 miles/h. The threshold wind speed for the windmill was determined to be 5.4 miles/h. The power reaches maximum at an optimum load ($R_{Load}^{opt}$). The optimum load ($R_{Load}^{opt}$) may be calculated as:

$$R_{Load}^{opt} = |R_S + |\frac{1}{j\omega C}; \quad (14)$$

where $R_S$ is the series resistance and C is the damped capacitance of the piezoelectric bimorph. The optimum load determined to be 20Ω.

Figure 15:
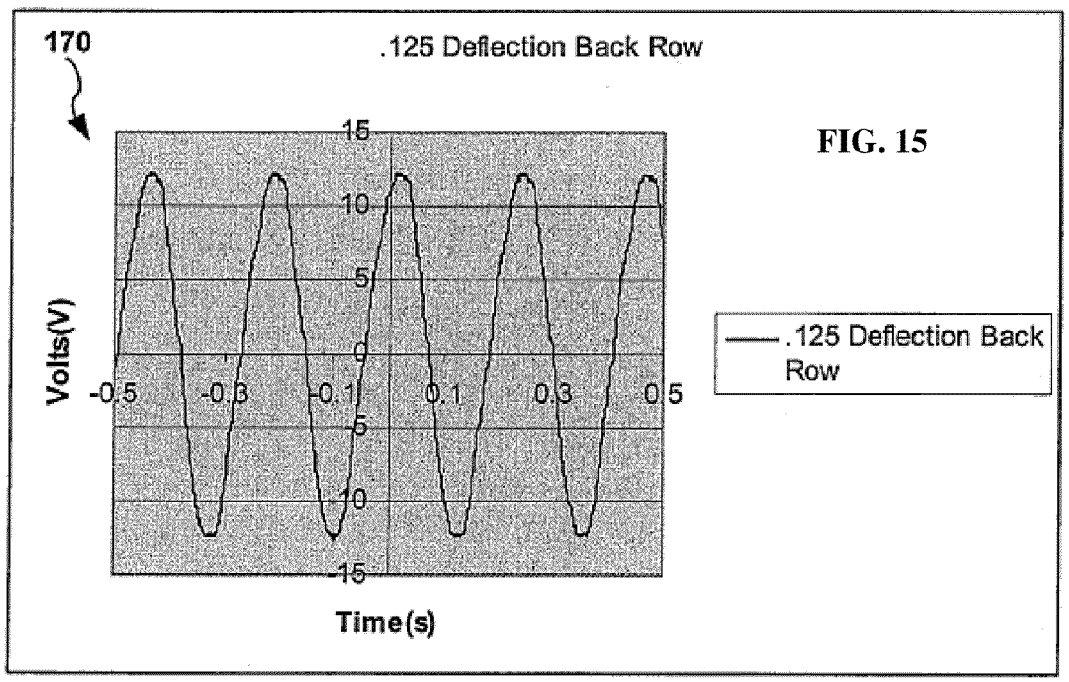
FIG. 15 is a waveform illustrating the voltage generated by a set of piezoelectric bimorphs in the piezoelectric windmill shown in FIGS. 11-11C according to one embodiment.

Referring to FIG. 15, a waveform illustrating the voltage generated by a set of piezoelectric bimorphs in the piezoelectric windmill shown in FIGS. 11A-11C according to one embodiment is shown. As shown, the output voltage wave form resulting from a total deflection of 0.125 inch to the back row of the bimorph group 102b reflects a clear sinusoidal signal with a Frequency of 4.5 Hz at the average wind speed of 10 miles/h. The magnitude of the output voltage was determined to be consistent with the predicted value, which may be calculated as:

$$V_{OC} \frac{3}{8} \left(\frac{H}{L}\right)^2 h_{31} \delta z; \quad (15)$$

where H=0.6 mm, L 53 mm, $h_{31}$=-1.67×10$^8$ V/m, and δz=1.5 mm. The magnitude of the $h_{31}$ constant was calculated using the magnitude of materials constants available for a piezoelectric ceramic APC 855. The open circuit voltage of the piezoelectric bimorph was determined to be 12.04 V, which is within the range of the observed values. The data in FIGS. 14 and 15 clearly show the strength of the piezoelectric windmill 90 as an electric energy generator.

Additionally, the voltage load and power may be calculated as:

$$V_{Load} = V_{OC} \left| \frac{R_{LOAD}}{R_{LOAD} + \frac{1}{j\omega C} + R_S} \right|; \quad (16)$$

$$P = \frac{V_{LOAD}^2}{2R_{LOAD}}. \quad (17)$$

Figure 16:
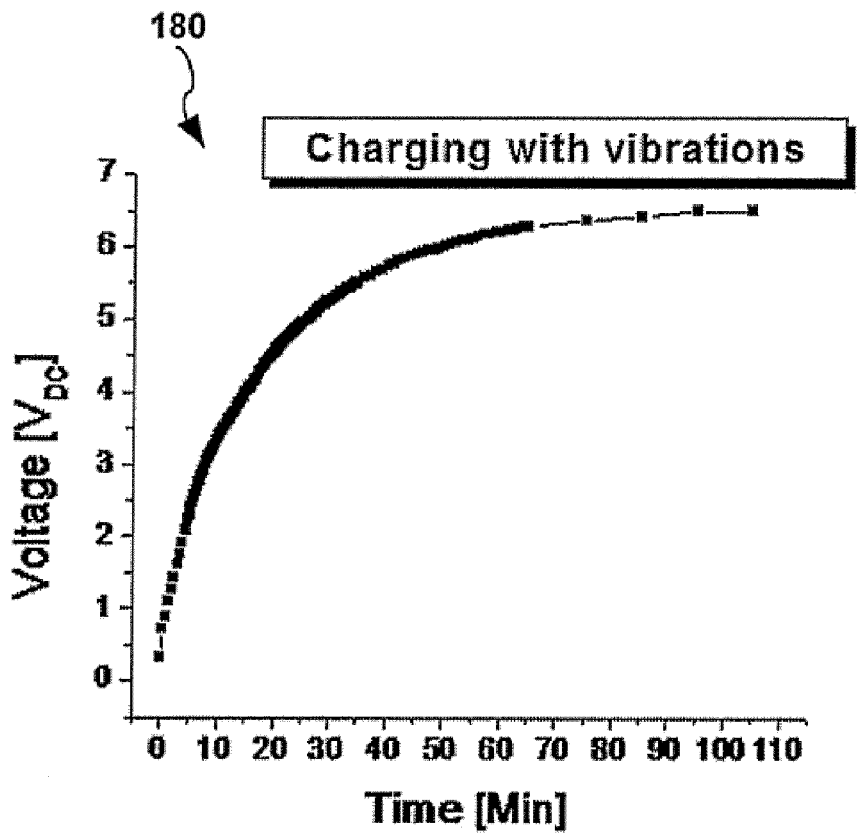
FIG. 16 is a chart illustrating the voltage over time that is generated by the piezoelectric bimorphs in the piezoelectric windmill shown in FIGS. 11A-11C according to one embodiment.

The generated power of one embodiment may be stored in a supercapacitor and then used to transmit sensor data wirelessly to remote locations. Examples of such sensors include temperature sensors, pressure sensors, light sensors, switches, and alarms which require power in the range of 10-50 mW. The combined power from the front and back rows of the bimorph groups 102a and 102b was determined to be 5 mW at a translation distance of 0.125 inch. Referring to FIG. 16, a chart illustrating the voltage over time that is accumulated by the bimorph groups 102a and 102b of the piezoelectric windmill 90 according to one embodiment is shown. As shown, approximately 6.5 V of voltage was accumulated by the piezoelectric windmill 90 in approximately 65 minutes.

Figure 17:
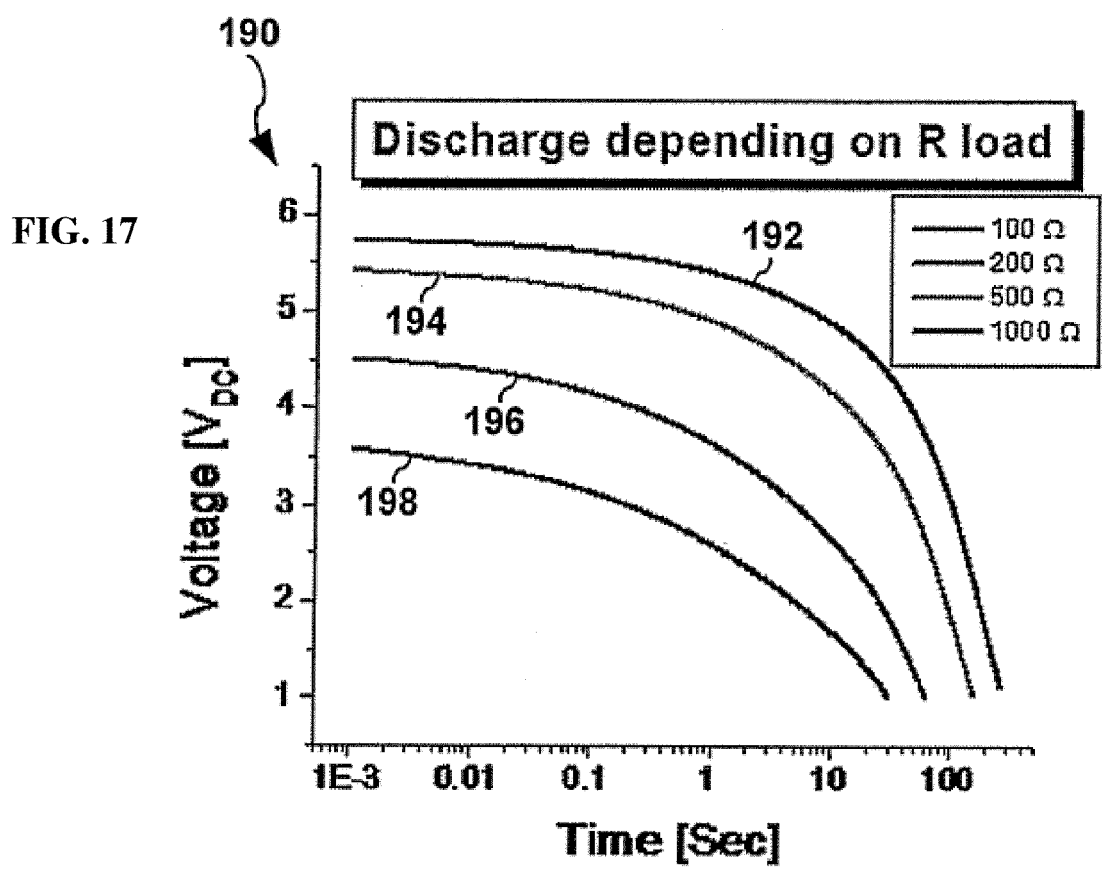
FIG. 17 is a chart illustrating the voltage over time that is discharged by the piezoelectric windmill shown in FIGS. 11A-11C according to one embodiment.
Figure 18:
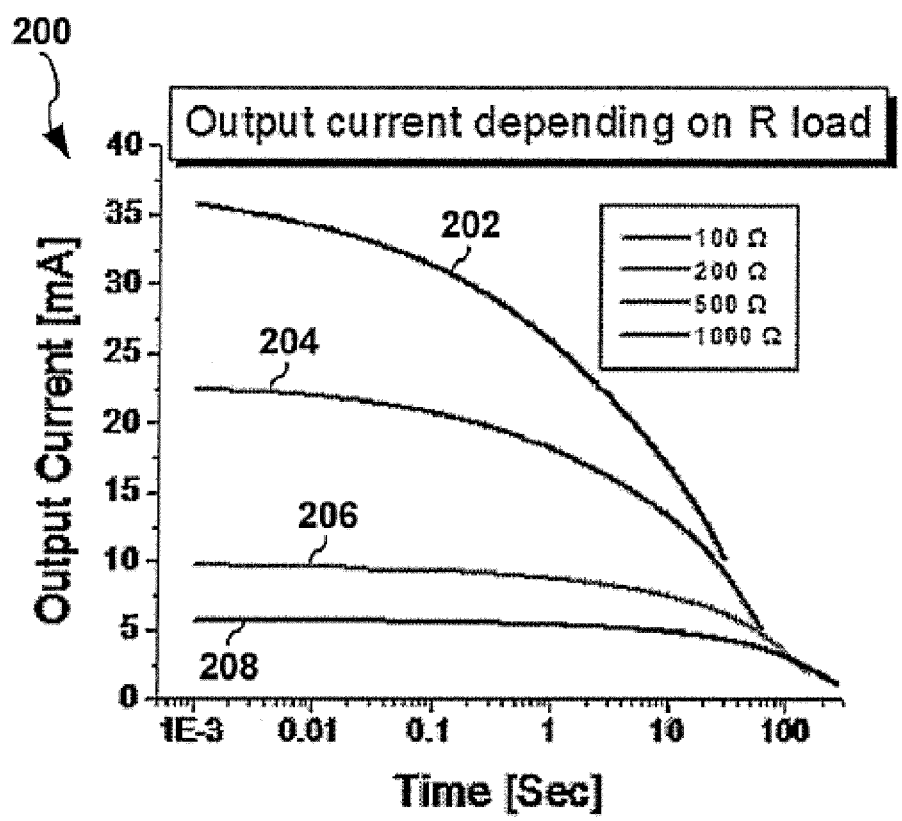
FIG. 18 is a chart illustrating the current over time that is discharged by the piezoelectric windmill shown in FIGS. 11A-11C according to one embodiment.
Figure 19:
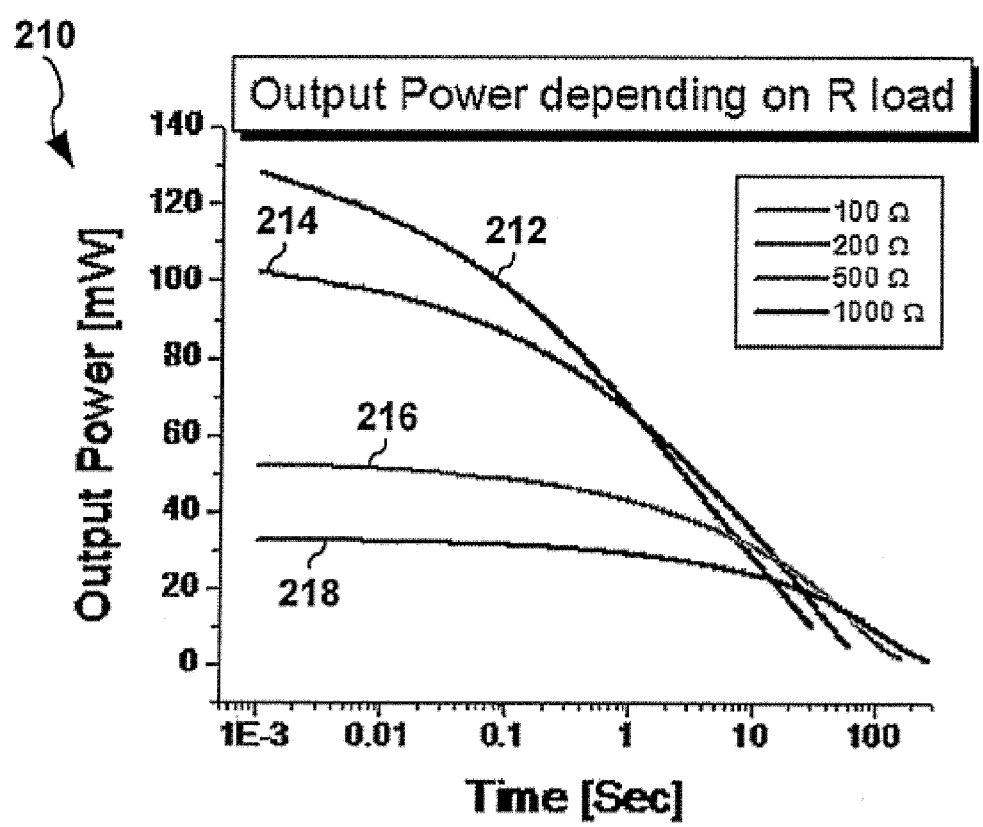
FIG. 19 is a chart illustrating the power output over time by the piezoelectric windmill shown in FIGS. 11A-11C according to one embodiment.

Referring to FIGS. 17-19, charts illustrating the discharge in voltage, current and power over time of the piezoelectric windmill 90 according to one embodiment are shown. In FIG. 17, elements 192, 194, 196 and 198 represent $R_{LOAD}$ values of 1000Ω, 500Ω, 200Ω and 100Ω, respectively. Likewise, in FIG. 18, elements 202, 204, 206 and 208 represent $R_{LOAD}$ values of 1000Ω, 500Ω, 200Ω, and 100Ω, respectively, and in FIG. 19, elements 212, 214, 216 and 218 represent $R_{LOAD}$ values of 1000Ω, 500Ω, 200Ω, and 100Ω, respectively. As shown in FIG. 17, the voltage is completely discharged in approximately 100 seconds for a $R_{LOAD}$ value of 200 a.

FIG. 20 is a waveform illustrating a variation of the rectified power as a function of the translation distance for the piezoelectric windmill with a 0.125 deflection according to one embodiment.

One embodiment thus includes a computer program which may be hosted on a storage medium and includes instructions which perform the processes set forth in the present specification. The storage medium can include, but is not limited to, any type of disk including floppy disks, optical disks, CD-ROMs, magneto-optical disks, ROMs, RAMS, EPROMs, EEPROMs, flash memory, magnetic or optical cards, or any type of media suitable for storing electronic instructions.

Obviously, many other modifications and variations of one embodiment are possible in light of the above teachings. The specific embodiments discussed herein are merely illustrative, and are not meant to limit the scope of one embodiment in any manner. It is therefore to be understood that within the scope of the disclosed concept, the invention may be practiced otherwise then as specifically described.

What is claimed is:

1. A windmill apparatus configured to handle small scale wind flow, comprising: a rotatable portion including: a shaft, a fan housing having an open interior and circumscribing the shaft, a plurality of fan blades each mounted on the fan housing, and a first plurality of permanent magnets each attached to the fan housing and having a direction of magnetization and poles, wherein the poles of the first plurality of permanent magnets face inward in a radial direction and alternate with each successive of the first plurality of permanent magnets; a stationary portion including: a housing for rotatably supporting the shaft, an electromagnetic generator means attached to the housing and rotatably connected to the shaft, wherein the electromagnetic generator means provides a first electrical output as the shaft is rotated, a stationary disc attached to the fan housing, a plurality of piezoelectric bimorphs attached to the disc, and a second plurality of permanent magnets each attached to a corresponding one of the plurality of piezoelectric bimorphs and having a direction of magnetization and poles, wherein the poles of the second plurality of permanent magnets face outward in a radial direction and alternate with each successive of the second plurality of permanent magnets, and wherein the second plurality of permanent magnets are in radial alignment with the first plurality of permanent magnets such that the plurality of piezoelectric bimorphs provide a second electrical output resulting from oscillations in the plurality of piezoelectric bimorphs as the fan housing is rotated and the second plurality of permanent magnets magnetically interact with the first plurality of permanent magnets; a first circuitry for combining the first electrical output and the second electrical output; and a second circuitry for providing the combined electrical output.

2. The windmill apparatus of claim 1, wherein the combined electrical output comprises an AC output.

3. The windmill apparatus of claim 1, wherein the combined electrical output comprises a DC output.

4. The windmill apparatus of claim 1, wherein said electromagnetic generator means further comprises a capacitor capable of storing energy, wherein the stored energy is transmitted and powers near and remote devices.

5. A windmill apparatus configured to handle small scale wind flow, comprising: a rotatable portion including: at least one shaft, and a plurality of fan blades each mounted on the at least one shaft, a connecting portion attached to the at least one shaft, wherein the connecting portion deflects when the at least one shaft is rotated; a stationary portion including: a housing for rotatably supporting one of the at least one shaft, and a plurality of piezoelectric bimorphs attached to the connecting portion, wherein the plurality of piezoelectric bimorphs are configured provide a first electrical output resulting from oscillations in the plurality of piezoelectric bimorphs as the shaft is rotated and the plurality of piezoelectric bimorphs are deflected by the connecting portion; and a first circuitry for providing the first electrical output.

6. The windmill apparatus of claim 5, further comprising: an electromagnetic generator means attached to the housing and rotatably connected to the shaft, wherein the electromagnetic generator means provides a second electrical output as the shaft is rotated.

7. The windmill apparatus of claim 6, wherein the connecting portion comprises a crank arm.

8. The windmill apparatus of claim 6, wherein the plurality of piezoelectric bimorphs are grouped into a first and second row piezoelectric bimorphs.

9. The windmill apparatus of claim 6, wherein said electromagnetic generator means further comprises a capacitor capable of storing energy, wherein the stored energy is transmitted and powers near and remote devices.

* * * * *